United States Patent
Kim et al.

(10) Patent No.: US 9,774,325 B2
(45) Date of Patent: Sep. 26, 2017

(54) GATE DRIVER AND DISPLAY DEVICE INCLUDING THE SAME

(71) Applicant: LG Display Co., Ltd., Seoul (KR)

(72) Inventors: DongSoo Kim, Jeollabuk-do (KR);
Hun Jeoung, Gyeonggi-do (KR);
SangHee Yu, Gyeonggi-do (KR);
SungHyun Cho, Seoul (KR); BoSun Lee, Chungcheongbuk-do (KR);
Sungwook Chang, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 20 days.

(21) Appl. No.: 14/969,280

(22) Filed: Dec. 15, 2015

(65) Prior Publication Data
US 2016/0182042 A1    Jun. 23, 2016

(30) Foreign Application Priority Data
Dec. 17, 2014    (KR) .......................... 10-2014-0182333

(51) Int. Cl.
| | |
|---|---|
| *G09G 3/36* | (2006.01) |
| *H03K 17/687* | (2006.01) |
| *G09G 3/3225* | (2016.01) |
| *G09G 3/3266* | (2016.01) |
| *G11C 19/28* | (2006.01) |

(Continued)

(52) U.S. Cl.
CPC ........... *H03K 17/6871* (2013.01); *G06F 1/04* (2013.01); *G09G 3/2092* (2013.01); *G09G 3/3225* (2013.01); *G09G 3/3266* (2013.01); *G09G 3/3648* (2013.01); *G09G 3/3677* (2013.01); *G11C 19/28* (2013.01); *G09G 2300/0408* (2013.01); *G09G 2300/0809* (2013.01); *G09G 2310/0224* (2013.01); *G09G 2310/0286* (2013.01); *G09G 2310/08* (2013.01); *G09G 2320/0214* (2013.01)

(58) Field of Classification Search
USPC ........................................................ 345/100
See application file for complete search history.

(56) References Cited

U.S. PATENT DOCUMENTS

| | | |
|---|---|---|
| 2004/0041774 A1 | 3/2004 | Moon et al. |
| 2010/0201668 A1* | 8/2010 | Ko ....................... G09G 3/3677 345/211 |

(Continued)

FOREIGN PATENT DOCUMENTS

KR    10-2014-0043203 A    4/2014

*Primary Examiner* — Roy Rabindranath
(74) *Attorney, Agent, or Firm* — Morgan, Lewis & Bockius LLP

(57) ABSTRACT

A gate driver and a display device including the gate driver are provided which can prevent an abnormal output of a gate-high voltage from a stage by stably maintaining a discharge potential of a pull-up node. The gate driver includes a plurality of stages, and each stage includes a pull-up transistor that outputs a clock signal input to a first clock terminal to an output terminal depending on a voltage of a pull-up node; a pull-down transistor that outputs a first source voltage input to a first source voltage terminal to the output terminal depending on a voltage of a pull-down node; and a first noise removing unit that supplies a gate-off voltage to the pull-up node to remove noise of the pull-up node in response to the clock signal input to the first clock terminal.

20 Claims, 20 Drawing Sheets

(51) Int. Cl.
  *G06F 1/04* (2006.01)
  *G09G 3/20* (2006.01)

(56) References Cited

U.S. PATENT DOCUMENTS

| | | |
|---|---|---|
| 2010/0207928 A1 | 8/2010 | Lee et al. |
| 2011/0148853 A1* | 6/2011 | Ko ................... G09G 3/3677 345/213 |
| 2012/0182050 A1* | 7/2012 | Yang ................ G09G 3/3266 327/109 |
| 2013/0027377 A1 | 1/2013 | Yang et al. |
| 2015/0287376 A1* | 10/2015 | Lim .................. G09G 3/3677 345/92 |

\* cited by examiner

GATE DRIVER AND DISPLAY DEVICE INCLUDING THE SAME

CROSS-REFERENCE TO RELATED APPLICATIONS

This application claims the benefit of the Korean Patent Application No. 10-2014-0182333, filed on Dec. 17, 2014, which is hereby incorporated by reference as if fully set forth herein.

BACKGROUND

Field of the Invention

The present invention relates to a gate driver and to a display device including the gate driver.

Discussion of the Related Art

With advancement of information society, requirements for display devices displaying an image have increased more and more in various forms. Accordingly, various flat panel display (FPD) devices have been developed and brought into the market which can reduce weight and volume which are demerits of cathode ray tubes. Various flat panel display devices such as a liquid crystal display (LCD), a plasma display panel (PDP), an organic light emitting diode (OLED) have been utilized.

Such a flat panel display device includes a display panel including data lines, gate lines, and pixels connected to the data lines and the gate lines, a gate driver supplying gate signals to the gate lines, and a data driver supplying data voltages to the data lines. The gate driver can be formed in a non-display area of the display panel and includes stages including plural transistors to supply the gate lines with gate signals which swing between a gate-high voltage and a gate-low voltage.

Each stage includes a pull-up node, a pull-down node, a pull-up transistor outputting a gate-high voltage when the pull-up node is charged, a pull-down transistor outputting a gate-low voltage when the pull-down node is charged, and a node controller controlling charging and discharging of the pull-up node and the pull-down node. At this time, the node controller discharges the pull-down node when the pull-up node is charged so as to stably output the gate-high voltage, and discharges the pull-up node when the pull-down node is charged so as to stably output the gate-low voltage.

FIG. 1 is a graph illustrating a drain-source current corresponding to a gate-source voltage of an N-type MOSFET. Referring to FIG. 1, a threshold voltage of the N-type MOSFET can be negatively shifted due to manufacturing errors, a stress based on long-term driving, or the like. When the threshold voltage Vth of the N-type MOSFET is negatively shifted, a curve representing the drain-source current Ids corresponding to the gate-source voltage Vgs of the N-type MOSFET can be moved to a curve B to which an original curve A is negatively shifted. Accordingly, the transistor of which the threshold voltage is negatively shifted may cause a problem with a leakage current.

On the other hand, a control circuit may include a transistor for removing noise of a pull-up node (hereinafter, referred to as a "noise removing transistor"). When the threshold voltage of the noise removing transistor is negatively shifted as illustrated in FIG. 1, ripples or noise may be reflected in the pull-up node due to the leakage current of the noise removing transistor. Accordingly, the discharge potential of the pull-up node is fluctuated and thus there may be a problem that a stage abnormally outputs a gate-high voltage.

SUMMARY

Accordingly, the present invention is directed a gate driver and a display device including the gate driver that substantially obviate one or more problems due to limitations and disadvantages of the related art.

An object of the present invention is to provide a gate driver that can prevent an abnormal output of a gate-high voltage from a stage by stably maintaining a discharge potential of a pull-up node and a display device including the gate driver.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purposed of the present invention, as embodied and broadly described, a gate driver comprises a plurality of stages, wherein a stage of the plurality of stages includes: a pull-up transistor that outputs a clock signal input to a first clock terminal to an output terminal depending on a voltage of a pull-up node; a pull-down transistor that outputs a first source voltage input to a first source voltage terminal to the output terminal depending on a voltage of a pull-down node; and a first noise removing unit that supplies a gate-off voltage to the pull-up node to remove noise of the pull-up node in response to the clock signal input to the first clock terminal.

In another aspect, a display device comprises a display panel that includes data lines, gate lines intersecting the data lines, pixels connected to the data lines and the gate lines, and a gate driver including stages outputting gate signals to the gate lines; and a data driver that supplies data voltages to the data lines, wherein each stage includes a pull-up transistor that outputs a clock signal input to a first clock terminal to an output terminal depending on a voltage of a pull-up node, a pull-down transistor that outputs a first source voltage input to a first source voltage terminal to the output terminal depending on a voltage of a pull-down node, and a first noise removing unit that supplies a gate-off voltage to the pull-up node to remove noise of the pull-up node in response to the clock signal input to the first clock terminal.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE ILLUSTRATED EMBODIMENTS

Figure 1:
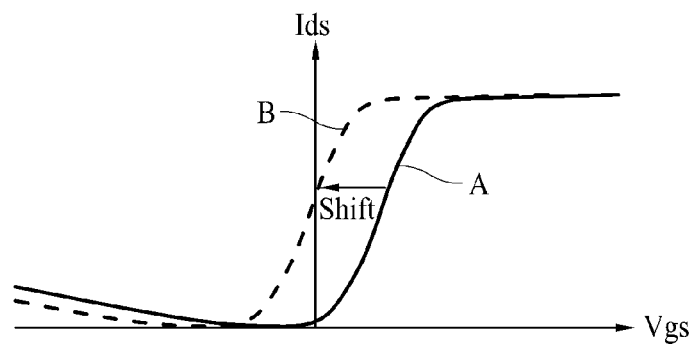
FIG. 1 is a graph illustrating a drain-source current corresponding to a gate-source voltage of an N-type MOSFET.

Hereinafter, exemplary embodiments of the present invention will be described in detail with reference to the accompanying drawings. Like reference numerals and signs in this specification will reference like elements. In the following description, when it is determined that detailed description of known functions or configurations involved in the invention makes the gist of the invention obscure, the detailed description thereof will not be made. The names of elements used in the following description may be selected in consideration of easy drafting of the specification and may be different from element names used in actual products.

Figure 2:
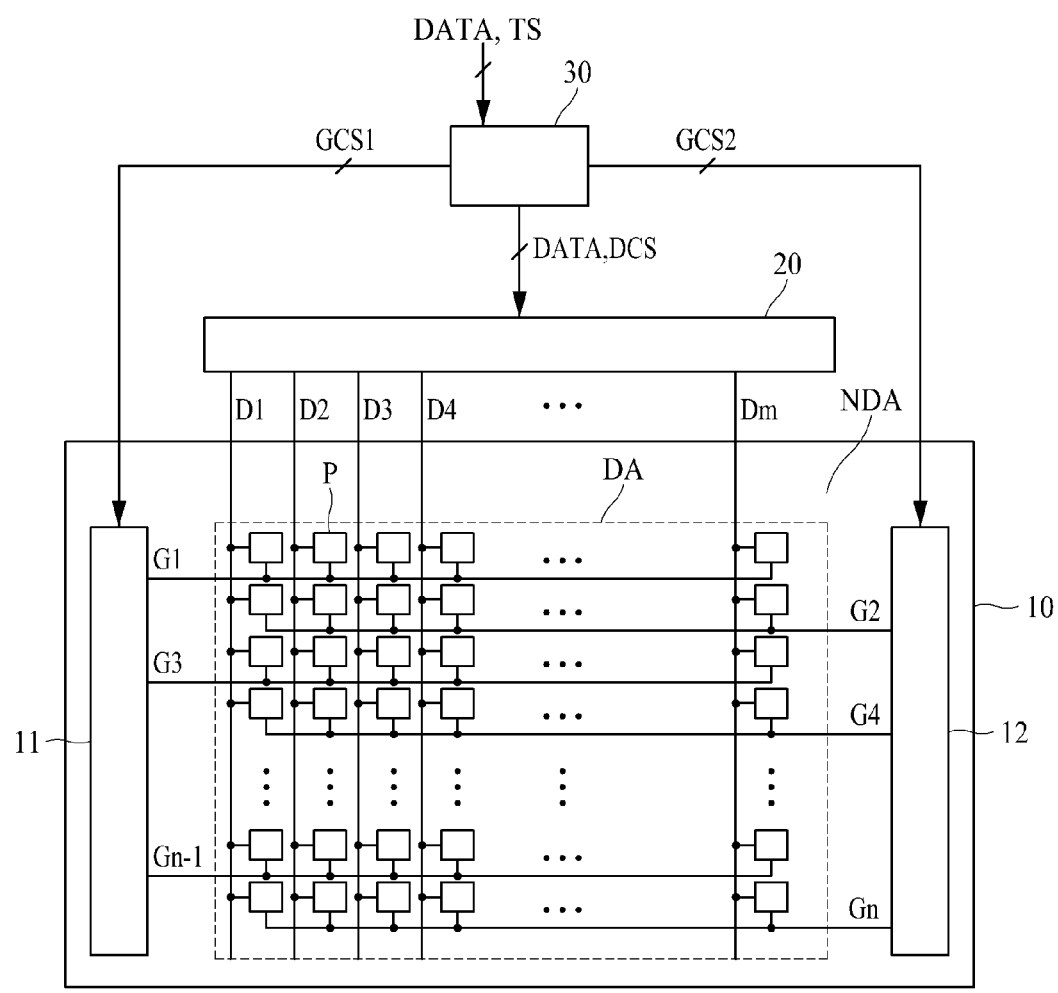
FIG. 2 is a block diagram illustrating a display device according to an embodiment of the present invention.

FIG. 2 is a block diagram illustrating a display device according to an embodiment of the present invention. Referring to FIG. 2, a display device according to an embodiment of the present invention includes a display panel 10, a data driver 20, and a timing controller 30.

The display device according to the embodiment of the present invention may include any display device in which data voltages are supplied to pixels in a line sequentially scanning method of sequentially supplying gate signals to gate lines G1 to Gn. For example, the display device according to the embodiment of the present invention may be embodied by any one of a liquid crystal display, an organic light emitting display, a field emission display, and an electrophoresis display.

The display panel 10 includes data lines D1 to Dm (where m is a positive integer equal to or greater than 2), gate lines G1 to Gn (where n is a positive integer equal to or greater than 2), pixels connected to the data lines D1 to Dm and the gate lines G1 to Gn, and first and second gate drivers 11 and 12.

A pixel can be connected to any one of the data lines D1 to Dm and any one of the gate lines G1 to Gn. Accordingly, the pixel P is supplied with a data voltage of the data line when the gate line is supplied with a gate signal, and emits light with predetermined brightness based on the supply data voltage.

Figure 3:
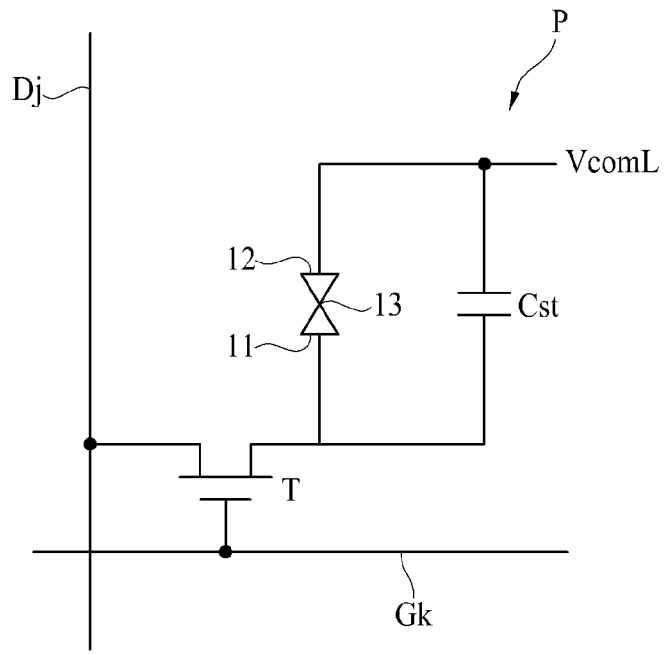
FIG. 3 is a diagram illustrating an example of a pixel in FIG. 2.

When the display device is embodied as a liquid crystal display device, each pixel P includes a transistor T, a pixel electrode 11, and a storage capacitor Cst as illustrated in FIG. 3. The transistor T supplies the data voltage of the j-th data line Dj (where j is a positive integer satisfying $1 \leq k \leq m$) to the pixel electrode 11 in response to the gate signal of the k-th gate line Gk (where k is a positive integer satisfying $1 \leq k \leq m$). Accordingly, each pixel P can drive liquid crystal of a liquid crystal layer 13 by an electric field generated due to a potential difference between the data voltage supplied to the pixel electrode 11 and a common voltage supplied to a common electrode 12 and can adjust transmittance of light incident from a backlight unit. The common electrode 12 is supplied with the common voltage from a common voltage line VcomL, and the backlight unit is disposed below the display panel 10 so as to irradiate the display panel 10 with uniform light. The storage capacitor Cst is disposed between the pixel electrode 11 and the common electrode 12 and keeps a voltage difference between the pixel electrode 11 and the common electrode 12 constant.

When the display device is embodied as an organic light emitting display device, each pixel P includes an organic light-emitting diode (OLED), a scanning transistor ST, a driving transistor DT, and a storage capacitor Cst. The scanning transistor ST supplies the data voltage of the j-th data line Dj to the gate electrode of the driving transistor DT in response to the gate signal of the k-th gate Gk. The driving transistor DT controls a driving current flowing from a high-potential voltage line VDDL to the organic light-emitting diode (OLED) based on the data voltage supplied to the gate electrode thereof. The organic light-emitting diode (OLED) is disposed between the driving transistor DT and a low-potential voltage line VSSL and emits light with predetermined brightness based on the driving current. The storage capacitor Cst can be disposed between the gate electrode of the driving transistor DT and the high-potential voltage line VDDL so as to keep the voltage of the gate electrode of the driving transistor DT constant.

The first gate driver 11 is connected to the odd-numbered gate lines G1, G3, . . . , Gn−1 to supply odd-numbered gate signals thereto, and the second gate driver 12 is connected to the even-numbered gate lines G2, G4, . . . , Gn to supply even-numbered gate signals thereto. That is, the first and second gate drivers 11 and 12 can be driven in an interlace mode. Specifically, the first gate driver 11 is supplied with a first gate control signal GCS1 from the timing controller 30, and generates and supplies the odd-numbered gate signals to the odd-numbered gate lines G1, G3, . . . , Gn−1 in response to the first gate control signal GCS1. The second gate driver 12 is connected to the even-numbered gate lines G2, G4, . . . , Gn and supplies the even-numbered gate signals thereto. The second gate driver 12 is supplied with a second gate control signal GCS2, and generates and supplies the even-numbered gate signals to the even-numbered gate lines G2, G4, . . . , Gn in response to the second gate control signal GCS2.

On the other hand, it should be noted that the first and second gate drivers 11 and 12 are not limited to the interlace driving mode. That is, the first gate driver 11 may supply the gate signals to some gate lines of the display panel 10 and the second gate driver 12 may supply the gate signals to the other gate lines of the display panel 10. Details of the first and second gate drivers 11 and 12 will be described later with reference to FIGS. 6A and 6B.

The display panel 10 can be partitioned into a display area DA and a non-display area NDA. The display area DA is an area in which pixels P are disposed and an image is displayed. The non-display area NDA is an area which is disposed around the display area DA and is an area in which an image is not displayed. The first and second gate drivers 11 and 12 can be disposed in the non-display area NDA in a gate driver in panel (GIP) manner. In FIG. 2, the first gate driver 11 is disposed in the non-display area on one side of the display panel 10 and the second gate driver 12 is disposed in the non-display area on the other side of the display panel 10, but the invention is not limited to this configuration.

The data driver 20 is connected to the data lines D1 to Dm. The data driver 20 is supplied with digital video data (DATA and a data control signal DCS from the timing controller 30 and converts the digital video data DATA into analog data voltages in response to the data control signal DCS. The data driver 20 supplies the analog data voltages to the data lines D1 to Dm. The data driver 20 can include one source driver integrated circuit (IC) or plural source drive ICs.

The timing controller 30 is supplied with digital video data DATA and timing signals TS from an external system board (not illustrated). The timing signals include a vertical sync signal, a horizontal sync signal, a data enable signal, and a dot clock. The timing controller 30 generates the first and second gate control signals GCS1 and GCS2 for controlling the operation timings of the first and second gate drivers 11 and 12 and the data control signal DCS for controlling the operation timing of the data driver 20 based on the timing signals.

Figure 7:
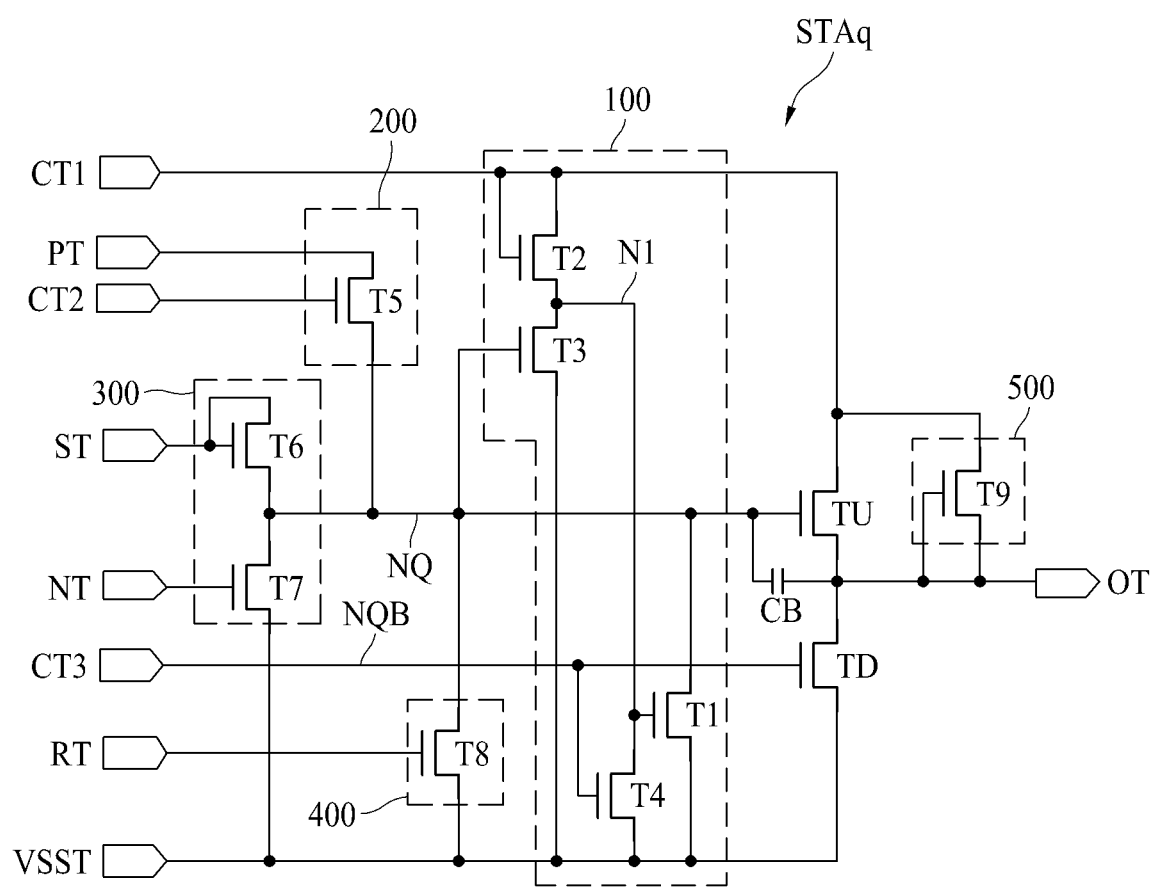
FIG. 7 is a circuit diagram illustrating an example of a q-th stage of the first gate driver in detail.

The first gate control signal GCS1 can include first and second start signals STV1 and STV2, some clock signals CLK1, CLK3, CLK5, and CLK7 of the clock signals, and a first reset signal RS1 as illustrated in FIG. 7. The second gate control signal GCS2 can include third and fourth start signals STV3 and STV4, the other clock signals CLK2, CLK4, CLK6, and CLK8 of the clock signals, and a second reset signal RS2. Details of the first and second gate control signals GCS1 and GCS2 will be described later with reference to FIG. 7.

The timing controller 30 supplies the digital video data DATA and the data control signal DCS to the data driver 20. The timing controller 30 supplies the first gate control signal GCS1 to the first gate driver 11 and supplies the second gate control signal GCS2 to the second gate driver 12.

On the other hand, when a video image of the digital video data DATA is a still image, the timing controller 30 can perform control of driving the display device so as to drive the display device with low power. That is, the timing controller 30 can perform control of driving the display device at a low refresh rate (LRR) or a variable refresh rate (VRR).

Figure 5A:
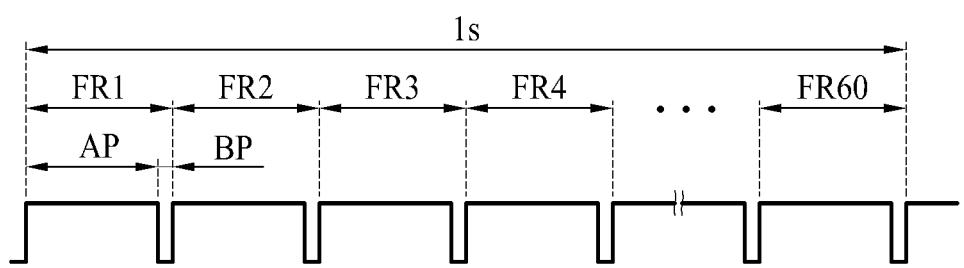
FIGS. 5A and 5B are diagrams illustrating active periods and blank periods at a frame frequency of 60 Hz and a frame frequency of 1 Hz.
Figure 5B:
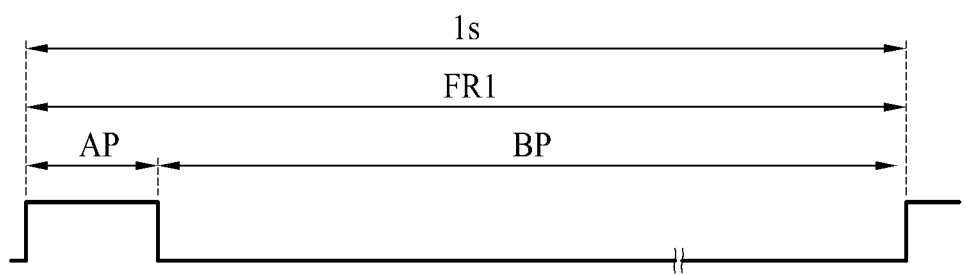

For example, the timing controller 30 can perform control of driving the display device at a frame frequency of 60 Hz as illustrated in FIG. 5A when the video image of the digital video data DATA is a moving image, and can perform control of driving the display device at a frame frequency of 1 Hz as illustrated in FIG. 5B when the video image of the video data DATA is a still image. In case of a frame frequency of 60 Hz, 60 frame periods FR1 to FR60 are present in one second (1 s) as illustrated in FIG. 5A. In case of a frame frequency of 1 Hz, one frame period FR1 is present in one second (1 s) as illustrated in FIG. 5B. Each frame period includes an active period AP and a block period BP. The active period AP is a period in which the first and second gate drivers 11 and 12 output the gate signals and the data driver 20 outputs the data voltages and supplies the data voltages to the pixels P. The blank period BP is an idle period which is interposed between the active periods AP. Accordingly, in the blank period BP, the first and second gate drivers 11 and 12 do not output the gate signals and the data driver 20 does not output the data voltages. When the display device is driven at a frame frequency of 1 Hz as illustrated in FIG. 5B, the blank period BP is much longer than the active period AP and thus power consumption of the display device can be reduced.

The timing controller 30 can perform control of driving the display device in a stop & start driving manner. The stop & start driving is a driving method of partitioning the display panel 10 into N blocks (where N is a positive integer equal to or greater than 2), partitioning the stages of the first and second gate drivers 11 and 12 into N blocks to correspond to the N blocks of the display panel 10, performing control of causing the stages, which are included in the blocks of the first and second gate drivers 11 and 12 corresponding to the blocks of the display panel 10 in which an image are displayed, to output the gate signals, and performing control of causing the stages, which are included in the blocks of the first and second gate drivers 11 and 12 corresponding to the blocks of the display panel 10 in which an image are not displayed, not to output the gate signals. Accordingly, the power consumption of the display device can be reduced.

Figure 6A:
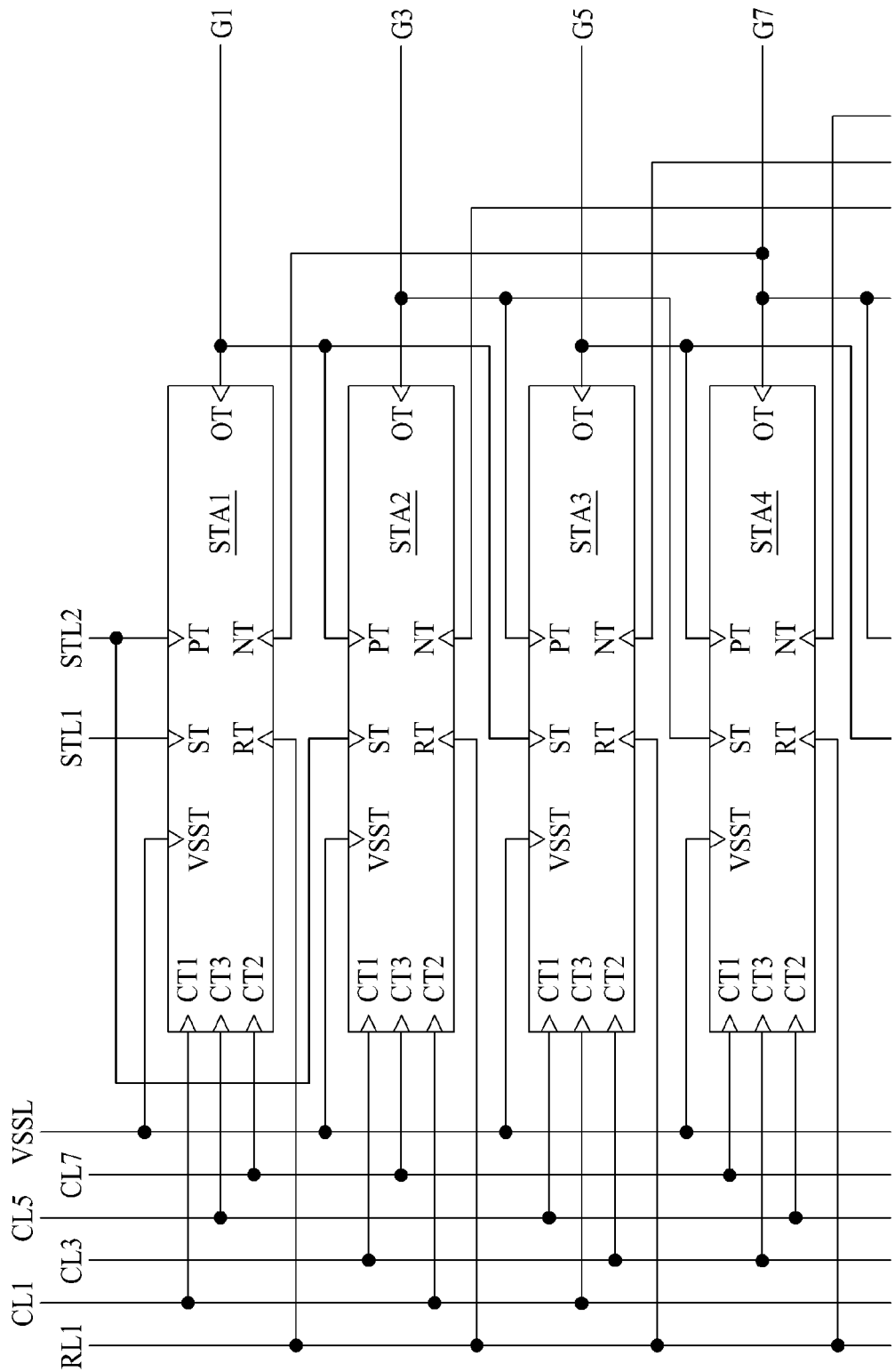
FIG. 6A is a block diagram illustrating an example of a first gate driver in FIG. 2.

FIG. 6A is a block diagram illustrating an example of the first gate driver in FIG. 2. Referring to FIG. 6A, the first gate driver 11 is provided with a first start signal line STL1 supplied with a first start signal, a second start signal line STL2 supplied with a second start signal, a first reset line RL1 supplied with a first reset signal, first, third, fifth, and seventh clock lines CL1, CL3, CL5, and CL7 supplied with first, third, fifth, and seventh clock signals, and a first source voltage line VSSL supplied with a first source voltage as a DC voltage. The first and second start signals, the first reset signal, and the first, third, fifth, and seventh clock signals are supplied from the timing controller 30 in FIG. 1 and the first source voltage can be supplied from a voltage source (not illustrated).

The first gate driver 11 includes stages STA1 to STAp (where p is a positive integer satisfying 2p=n) connected to the odd-numbered gate lines G1, G3, . . . , Gn+1. In FIG. 6A, for the purpose of convenience of explanation, only the first to fourth stages STA1 to STA4 connected to the first, third, fifth, and seventh gate lines G1, G3, G5, and G7 are illustrated.

In the following description, a "previous stage" represents a stage which is located previous to a reference stage. A "subsequent stage" represents a stage which is located subsequent to the reference stage. For example, the previous stages of the third stage STA3 represent the first and second stages STA1 and STA2 and the subsequent stages of the third stage STA3 represent the fourth to p-th stages STA4 to STAp.

The q-th stage STAq (where q is a positive integer satisfying 1≤q≤p) of the first gate driver 11 is connected to the q-th gate line Gq to output the gate signal thereto.

Each of the stages STA1 to STAp includes a start terminal ST, a reset terminal RT, a previous-stage carrier signal input terminal PT, a subsequent-stage carrier signal input terminal NT, a first to third clock terminals CT1, CT2, and CT3, a first source voltage terminal VSST, and an output terminal OT.

The start terminal of each of the stages STA1 to STAp is connected to the first start signal line STL1, the second start signal line STL2 or the output terminal OT of the second previous stage. That is, the start terminal ST of the q-th stage STAq can be connected to the first start signal line STL1, the second start signal line STL2, or the output terminal OT of the (q−2)-th stage STAq−2. In this case, the first start signal of the first start signal line STL1, the second start signal of the second start signal line STL2, or the output signal of the output terminal OT of the (q−2)-th stage STAq−2 can be input to the start terminal ST of the q-th stage STAq. For example, as illustrated in FIG. 6A, since the first and second stages STA1 and STA2 do not have the second previous stage, the start terminal ST of the first stage STA1 is connected to the first start signal line STL1 and is supplied with the first start signal, and the start terminal ST of the second stage STA2 is connected to the second start signal line STL2 and is supplied with the second start signal. As illustrated in FIG. 6A, the start terminals ST of the third to p-th stages STA3 to STAp are connected to the output terminals OT of the second previous stages and are supplied with the output signals of the output terminals OT of the second previous stages.

The reset terminals RT of the stages STA1 to STAp are connected to the reset signal line RL. The reset signal is input to the reset terminals RT of the stages STA1 to STAp.

A previous-stage output signal input terminal PT of each of the stages STA1 to STAp is connected to the second start signal line STL2 or the output terminal OT of the first previous stage. That is, the previous-stage output signal input terminal PT of the q-th stage STAq is connected to the second start signal line STL2 or the output terminal OT of the (q−1)-th stage STAq−1. In this case, the second start signal of the second start signal line STL2 or the output signal of the output terminal OT of the (q−1)-th stage STAq−1 is input to the previous-stage output signal input terminal PT of the q-th stage STAq. For example, since the first stage has no first previous stage as illustrated in FIG. 6A, the previous-stage output signal input terminal PT of the first stage STA1 is connected to the second start signal line STL2 and is supplied with the second start signal therefrom. As illustrated in FIG. 6A, the previous-stage output signal input terminal PT of each of the second to p-th stages STA2 to STAp is connected to the output terminal of the first previous stage and is supplied with the output signal of the output terminal OT of the first previous stage. The first previous stage of the q-th stage STAq represents the (q−1)-th stage STAq−1.

The subsequent-stage output signal input terminal NT of each of the stages STA1 to STAp is connected to the output terminal OT of the third subsequent stage. The third subsequent stage of the q-th stage STAq represents the (q+3)-th stage STAq+3. That is, the subsequent-stage output signal input terminal NT of the q-th stage STAq is connected to the output terminal OT of the (q+3)-th stage STAq+3. In this case, the output signal of the output terminal OT of the (q+3)-th stage STAq+3 is input to the q-stage STAq.

Figure 8:
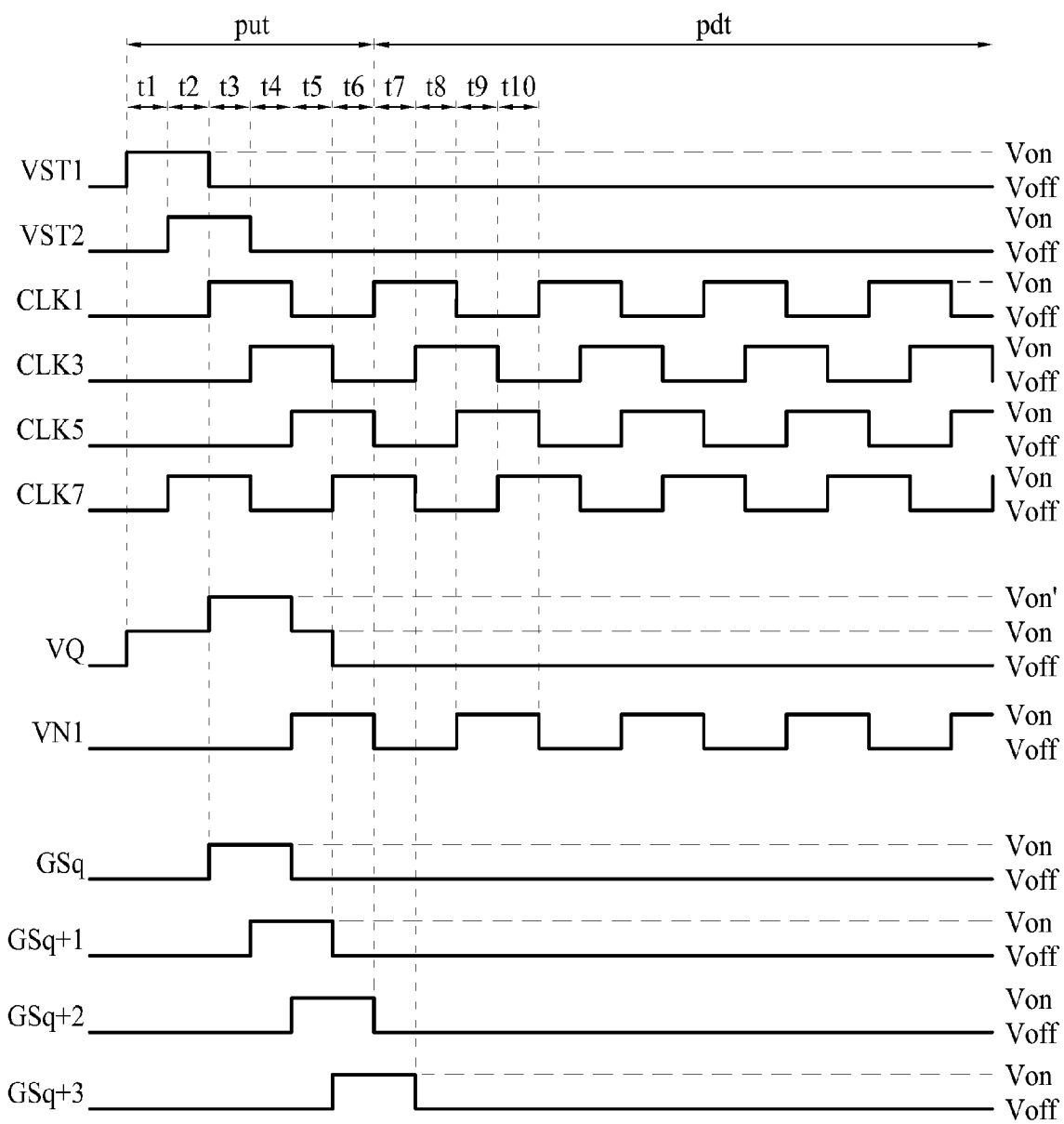
FIG. 8 is a waveform diagram illustrating signals input to a start terminal of the q-th stage in FIG. 1 and a previous-stage output signal input terminal, clock signals, a voltage of a pull-up node, and q-th to (q+3)-th gate signals.

The first to third clock terminals CT1, CT2, and CT3 of each of the stages STA1 to STAp are connected to the corresponding ones of the first, third, fifth, and seventh clock lines CL1, CL3, CL5, and CL7. It is preferable that the clock signals be embodied by i-phase clock signals (where i is a natural number equal to or greater than 4) of which phases are sequentially delayed to secure a sufficient charge time. In this embodiment, it is assumed that the clock signals are 8-phase clock signals which overlap with each other in a predetermined period and of which phases are sequentially delayed as illustrated in FIG. 8, but the invention is not limited to this configuration. Each of the clock signals has a predetermined cycle and swings between a gate-high voltage VGH and a gate-low voltage VGL.

The first to third clock terminals CT1, CT2, and CT3 of the stages STA1 to STAp are connected to different clock lines. Accordingly, different clock signals are input to the first to third clock terminals CT1, CT2, and CT3 of the stages STA1 to STAp. For example, as illustrated in FIG. 6A, the first clock terminal CT1 of the first stage STA1 is connected to the first clock line CL1, the second clock terminal CT2 thereof is connected to the seventh clock line CL7, and the third clock terminal CT3 thereof is connected to the fifth clock line CL5. In this case, the third clock signal CLK3 is input to the first clock terminal CT1 of the second stage STA2, the first clock signal CLK1 is input to the second clock terminal CT2 thereof, and the seventh clock signal CLK 7 is input to the third clock terminal CT3 thereof.

The odd-numbered clock signals are sequentially supplied to the first to third clock terminals CT1, CT2, and CT3 of each of the stages STA1 to STAq. For example, as illustrated in FIG. 6A, the first clock terminal CT1 of the first stage STA1 is connected to the first clock line CL1 and is supplied with the first clock signal, the first clock terminal CT1 of the second stage STA2 is connected to the third clock line CL3 and is supplied with the third clock signal, and the first clock terminal CT1 of the third stage STA3 is connected to the fifth clock line CL5 and is supplied with the fifth clock signal. As illustrated in FIG. 6A, the second clock terminal CT2 of the first stage STA1 is connected to the seventh clock line CL7 and is supplied with the seventh clock signal, the second clock terminal CT2 of the second stage STA2 is connected to the first clock line CL1 and is supplied with the first clock signal, and the second clock terminal CT2 of the third stage STA3 is connected to the third clock line CL3 and is supplied with the third clock signal. As illustrated in FIG. 6A, the third clock terminal CT3 of the first stage STA1 is connected to the fifth clock line CL5 and is supplied with the fifth clock signal, the third clock terminal CT3 of the second stage STA2 is connected to the seventh clock line CL7 and is supplied with the seventh clock signal, and the third clock terminal CT3 of the third stage STA3 is connected to the first clock line CL1 and is supplied with the first clock signal.

The first source voltage terminal VSST of each of the stages STA1 to STAp is connected to the first source voltage line VSSL. Accordingly, the first source voltage terminal VSST of each of the stages STA1 to STAp is supplied with the first source voltage.

The output terminal OT of each of the stages STA1 to STAp is connected to the gate line. The gate signal is output to the output terminal OT of each of the stages STA1 to STAp. The output terminal OT of each of the stages STA1 to STAp is connected to the previous-stage output signal input terminal PT of the first subsequent stage, the start terminal ST of the second subsequent stage, and the subsequent-stage output signal input terminal NT of the third previous stage. The first subsequent stage of the q-the stage STAq represents the (q+1)-th stage STAq+1, the second subsequent stage thereof represents the (q+2)-th stage STAq+2, and the third previous stage represents the (q−3)-th stage STAq−3.

Figure 6B:
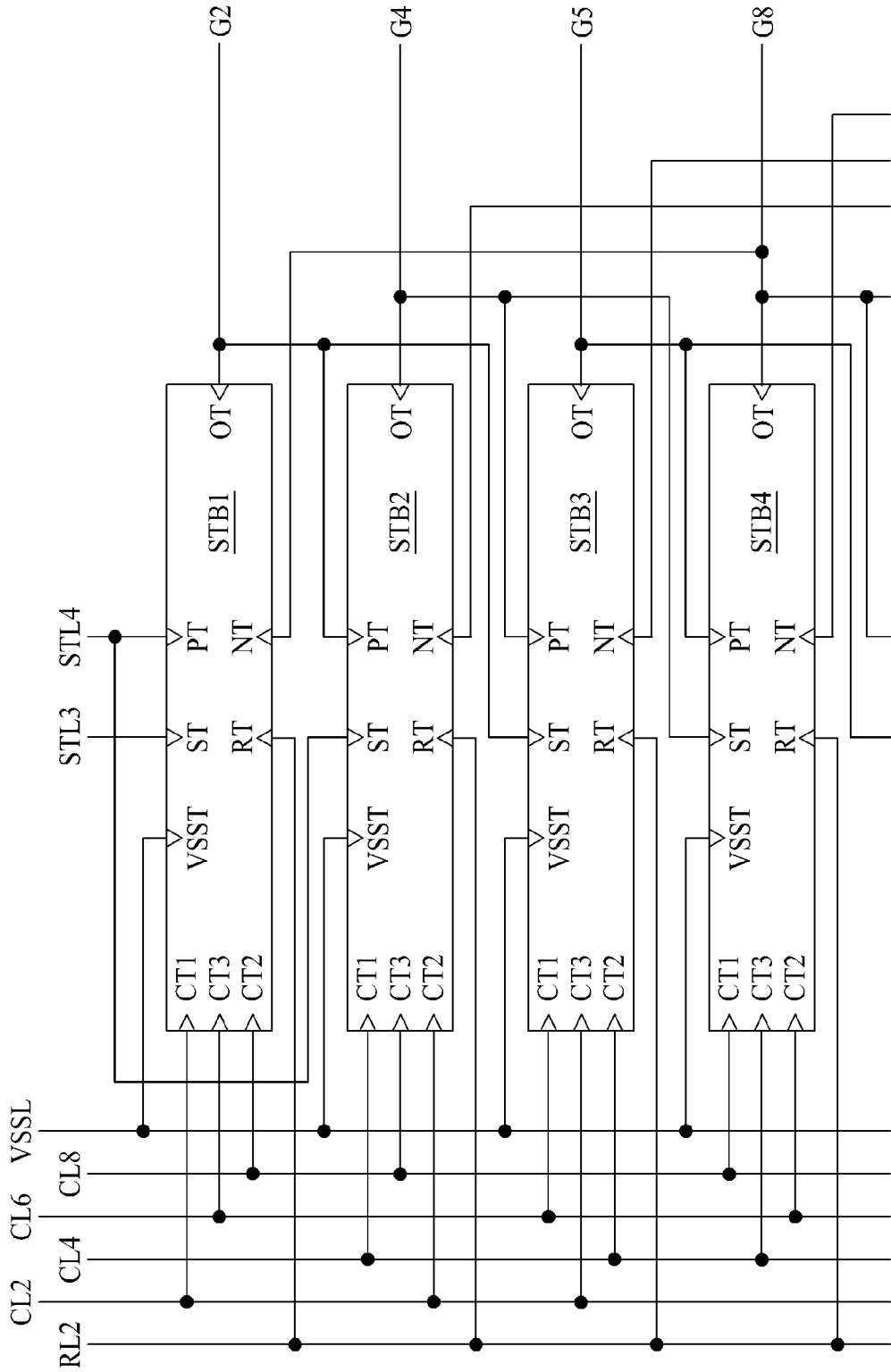
FIG. 6B is a block diagram illustrating an example of a second gate driver in FIG. 2.

FIG. 6B is a block diagram illustrating an example of the second gate driver in FIG. 2. Referring to FIG. 6B, the second gate driver 12 is provided with a third start signal line STL3 supplied with a third start signal, a fourth start signal line STL4 supplied with a fourth start signal, a second reset line RL2 supplied with a second reset signal, second, fourth, sixth, and eighth clock lines CL2, CL4, CL6, and CL8 supplied with second, fourth, sixth, and eighth clock signals which are even-numbered clock signals, and a first source voltage line VSSL supplied with a first source voltage as a DC voltage. The third and fourth start signals, the second reset signal, and the second, fourth, sixth, and eighth clock signals are supplied from the timing controller 30 in FIG. 1 and the first source voltage can be supplied from a voltage source (not illustrated).

The second gate driver 12 includes stages STB1 to STBp connected to the even-numbered gate lines G2, G4, ..., Gn. In FIG. 6B, for the purpose of convenience of explanation, only the first to fourth stages STB1 to STB4 connected to the second, fourth, sixth, and eighth gate lines G2, G4, G6, and G8 are illustrated.

The q-stage of the second gate driver 12 is connected to the 2q-th gate line G2q and outputs the gate signal thereto.

Each of the stages STB1 to STBp of the second gate driver 12 is substantially equal to the stages STA1 to STAp of the first gate driver 11 described above with reference to FIG. 6A, except that the third and fourth start signal lines STL3 and STL4, the second reset line RL2, and the second, fourth, sixth, and eighth clock lines CL2, CL4, CL6, and CL8 are connected instead of the first and second start lines STL1 and STL2, the first reset line RL1, and the first, third, fifth, and seventh clock lines CL1, CL3, CL5, and CL7. Accordingly, detailed description of the stages STB1 to STBp of the second gate driver 12 will not be repeated.

FIG. 7 is a circuit diagram illustrating an example of the q-stage of the first gate driver. In FIG. 7, for the purpose of convenience of explanation, it is assumed that the pull-up node is a Q node NG and the pull-down node is a QB node NGB.

Referring to FIG. 7, the q-th stage STAq of the first gate driver 11 includes a pull-up transistor TU, a pull-down transistor TD, a first noise removing unit 100, a second noise removing unit 200, a Q node charging and discharging unit 300, a Q node reset unit 400, an output terminal noise removing unit 500, and a boosting capacitor CB.

The gate electrode of the pull-up transistor TU is connected to the Q node NQ, the first electrode thereof is connected to the output terminal OT, and the second electrode thereof is connected to the first clock terminal CT1. The pull-up transistor TU is turned in response to a gate-on voltage of the Q node NQ and supplies the output terminal OT with the clock signal input to the first clock terminal CT1. When the pull-up transistor TU is turned on in response to the gate-on voltage of the Q node NQ and the clock signal of the gate-on voltage is input to the first clock terminal CT1, the gate signal of the gate-on voltage is output to the output terminal OT.

The gate electrode of the pull-down transistor TD is connected to the third clock terminal CT3, the first electrode thereof is connected to the first source voltage terminal VSST, and the second electrode thereof is connected to the output terminal OT. The pull-down transistor TD is turned on in response to the gate-on voltage of the QB node NQB and supplies the output terminal OT with the first source voltage input to the first source voltage terminal VSST. When the pull-down transistor TD is turned on in response to the gate-on voltage of the QB node NQB, the gate signal of the gate-on voltage is output to the output terminal OT. In the following description, it is assumed that the first source voltage input to the first source voltage terminal VSST is a gate-off voltage. The gate-off voltage is a voltage that can turn off the transistors of the pixels P connected to the gate lines G1 to Gn and the gate-on voltage is a voltage that can turn on the transistors. When the transistors are N-type MOSFETs, the gate-on voltage can be set to a gate-high voltage and the gate-off voltage can be set to a gate-low voltage.

The first noise removing unit 100 removes noise of the Q node NQ in response to the clock signal input to the first clock terminal CT1. The first noise removing unit 100 includes first to fourth transistors T1, T2, T3, and T4.

The gate electrode of the first transistor T1 is connected to a first node N1, the first electrode thereof is connected to the first source voltage terminal VSST, and the second electrode thereof is connected to the Q node NQ. The first transistor T1 is turned on in response to the gate-on voltage of the first node N1 and connects the Q node NQ to the first source voltage terminal VSST. When the first transistor T1 is turned on, the gate-off voltage is supplied to the Q node NQ and thus the pull-up transistor TU is turned off.

The gate electrode and the second electrode of the second transistor T2 are connected to the first clock terminal CT1 and the first electrode thereof is connected to the first node N1. That is, the second transistor T2 is diode-connected. The second transistor T2 is turned on in response to the gate-on voltage of the clock signal input to the first clock terminal CT1 and supplies the gate-on voltage to the first node N1. When the second transistor T2 is turned on, the gate-on voltage is supplied to the first node N1 and thus the first transistor T1 is turned on.

The gate electrode of the third transistor T3 is connected to the Q node NQ, the first electrode thereof is connected to the first source voltage terminal VSST, and the second electrode thereof is connected to the first node N1. The third transistor T3 is turned on in response to the gate-on voltage of the Q node NQ and connects the first node N1 to the first source voltage terminal VSST. When the third transistor T3 is turned on, the gate-off voltage is supplied to the first node N1 and thus the first transistor T1 is turned off.

The gate electrode of the fourth transistor T4 is connected to the QB node NQB, the first electrode thereof is connected to the first source voltage terminal VSST, and the second electrode thereof is connected to the first node N1. The fourth transistor T4 is turned on in response to the gate-on voltage of the QB node NQB and connects the first node N1 to the first source voltage terminal VSST. When the fourth transistor T4 is turned on, the gate-off voltage is supplied to the first node N1 and thus the first transistor T1 is turned off.

The second noise removing unit 200 removes noise of the Q node NQ in response to the clock signal input to the second clock terminal CT2. The second noise removing unit 200 includes a fifth transistor T5.

The gate electrode of the fifth transistor T5 is connected to the second clock terminal CT2, the first electrode thereof is connected to the Q node NQ, and the second electrode thereof is connected to the previous-stage output signal input terminal PT. The fifth transistor T5 is turned on in response to the gate-on voltage of the clock signal input to the second clock terminal CT2 and connects the Q node NQ to the previous-stage output signal input terminal PT. When the fifth transistor T5 is turned on, the Q node NQ is supplied with the gate-on voltage or the gate-off voltage of the output signal of the (q−1)-th stage STAq−1 input from the previous-stage output signal input terminal PT. When the fifth transistor T5 is turned on and the gate-off voltage is supplied to the Q node NQ, the noise of the Q node NQ is removed.

The Q node charging and discharging unit 300 charges the Q node NQ with the gate-on voltage in response to the first start signal or the second start signal input to the start terminal ST or the output signal of the (q−2)-th stage STAq−2, or discharges the Q node NQ to the output signal of the gate-off voltage in response to the (q+3)-th stage STAq+3 input to the subsequent-stage output signal input terminal NT. The Q node charging and discharging unit 300 includes sixth and seventh transistors.

The gate electrode and the second electrode of the sixth transistor T6 are connected to the start terminal ST and the first electrode thereof is connected to the Q node NQ. That is, the sixth transistor T6 is diode-connected. The sixth transistor T6 is turned on in response to the gate-on voltage of the first start signal, the second start signal, or the output signal of the (q−2)-th stage STAq−2 input to the start terminal ST and supplies the gate-on voltage to the Q node NQ. When the sixth transistor T6 is turned on, the gate-on voltage is supplied to the Q node NQ and thus the pull-up transistor TU is turned on.

The gate electrode of the seventh transistor T7 is connected to the subsequent-stage output signal input terminal NT, the first electrode thereof is connected to the first source voltage terminal VSST, and the second electrode thereof is connected to the Q node NQ. The seventh transistor T7 is turned on in response to the gate-on voltage of the output signal of the (q+3)-th stage STAq+3 input to the subsequent-stage output signal input terminal NT and supplies the gate-off voltage to the Q node NQ. When the seventh transistor T7 is turned on, the gate-off voltage is supplied to the Q node NQ and thus the pull-up transistor TU is turned off.

The Q node reset unit 400 resets the Q node NQ to the gate-off voltage in response to the first reset signal input to the reset terminal RT. The Q node reset unit 400 includes an eighth transistor T8.

The gate electrode of the eighth transistor T8 is connected to the reset terminal RT, the first electrode thereof is connected to the first source voltage terminal VSST, and the second electrode thereof is connected to the Q node NQ. The eighth transistor T8 connects the Q node NQ to the first source voltage terminal VSST in response to the gate-on voltage of the first reset signal input to the reset terminal RT. When the eighth transistor T8 is turned on, the Q node NQ is reset to the gate-off voltage.

The output terminal noise removing unit 500 connects the output terminal OT to the first clock terminal CT1 to remove the noise of the output terminal OT depending on the voltage of the output terminal OT. The output terminal noise removing unit 500 includes a ninth transistor T9.

The gate electrode and the first electrode of the ninth transistor T9 are connected to the output terminal OT and the second electrode thereof is connected to the first clock terminal CT1. That is, the ninth transistor T9 is diode-connected. When the voltage of the output terminal OT is higher than the sum of the voltage of the clock signal input to the first clock terminal OT and the threshold voltage of the ninth transistor T9, the ninth transistor T9 connects the output terminal OT to the first clock terminal CT1. Accordingly, when noise is generated in the output terminal OT and the voltage of the output terminal OT is higher than the sum of the gate-off voltage of the clock signal input to the first clock terminal OT and the threshold voltage of the ninth transistor T9, the noise of the output terminal OT is discharged to the first clock terminal OT.

The boosting capacitor CB is connected between the output terminal OT and the Q node NQ. The boosting capacitor CB maintains the difference voltage between the output terminal OT and the Q node NQ.

The first electrodes of the pull-up transistor TU, the pull-down transistor TD, and the first to ninth transistors T1 to T9 are source electrodes and the second electrodes thereof are drain electrodes, but the present invention is not limited to this configuration. The first electrodes of the pull-up transistor TU, the pull-down transistor TD, and the first to ninth transistors T1 to T9 may be drain electrodes and the second electrodes thereof may be source electrodes On the other hand, in the display device according to the embodiment of the present invention, when the display device is driven in a low refresh rate or a variable refresh rate or is driven in a stop & stop manner to reduce power consumption, the blank period BP is elongated and thus it is preferable that the semiconductor layers of the pull-up transistor TU, the pull-down transistor TD, and the first to ninth transistors T1 to T9 be formed of oxide. However, the semiconductor layers of the pull-up transistor TU, the pull-down transistor TD, and the first to ninth transistors T1 to T9 are not limited to oxide, but may be formed of amorphous silicon (a-Si) or polysilicon (Poly-Si).

On the other hand, only the q-stage STAq is illustrated in FIG. 7 for the purpose of convenience of explanation, but the stages STA1 to STAp of the first gate driver 11 and the stages STB1 to STBp of the second gate driver 12 can be formed with substantially the same configuration as the q-th stage STAq illustrated in FIG. 7.

As described above, the q-th stage STAq according to the embodiment of the present invention includes plural noise removing units 100 and 200 and can remove the noise of the Q node NQ. As a result, in the embodiment of the present invention, even when the threshold voltage of the transistor of one noise removing unit is negatively shifted, the noise of the Q node NQ can be removed using the other noise removing unit. Accordingly, in the embodiment of the present invention, since the discharge potential of the pull-up node can be stably maintained, it is possible to prevent an abnormal output of the gate-on voltage of the stages. Details of the operation of the plural noise removing units 10 and 20 according to the embodiment of the present invention will be described later with reference to FIG. 8, FIGS. 9A to 9G, and FIGS. 10A to 10D.

FIG. 8 is a waveform diagram illustrating the signals input to the start terminal of the q-stage and the previous-stage output signal input terminal in FIG. 7, the clock signals, the voltage of the pull-up node, and the q-th to (q+3)-th gate signals. In FIG. 8, the first start signal VST1 input to the start terminal ST of the q-th stage STAq, the second start signal VST2 input to the previous-stage output signal input terminal PT, the first, third, fifth, and seventh clock signals CLK1, CLK3, CLK5, and CLK7, the voltage VQ of the Q node, the voltage VN1 of the first node N1, and the q-th to (q+3)-th gate signals GS1, SGq+1, and GSq+3 are illustrated. The output signal GSq−2 of the (q−2)-th stage STAq−2 instead of the first start signal VST1 can be input to the start terminal ST of the q-th stage STA1, and the output signal GSq−1 of the (q−1)-th stage STAq−1 instead of the second start signal VST2 can be input to the previous-stage output signal input terminal PT of the q-th stage STAq.

Referring to FIG. 8, the first and second start signals VST1 and VST2 swing between the gate-on voltage Von and the gate-off voltage Voff. The pulse of the gate-on voltage Voff of the first start signal VST1 is earlier generated than the pulse of the gate-on voltage Von of the second gate signal VST2. The pulse of the gate-on voltage Von of the first start signal VST1 can overlap the pulse of the gate-on voltage Von of the second start signal VST2 by a predetermined period.

The clock signals CLK1, CLK3, CLK5, and CLK7 can overlap by a predetermined period and can be embodied by 8 phases which are sequentially delayed, but the present invention is not limited to this configuration. FIG. 8 illustrates only the odd-numbered clock signals CLK1, CLK3, CLK5, and CLK7.

The clock signals CLK1, CLK3, CLK5, and CLK7 swing between the gate-on voltage Von and the gate-off voltage Voff. Each of the clock signals CLK1, CLK3, CLK5, and CLK7 has the gate-on voltage Von in four horizontal periods and has the gate-off voltage Voff in four horizontal periods. In this case, the odd-numbered clock signals CLK1, CLK3, CLK5, and CLK7 overlap each other by two horizontal periods. One horizontal period represents one horizontal line scanning period in which data voltages are supplied to the pixels connected to one gate line of the display panel 10.

On the other hand, the operation period of the q-th stage STAq can be partitioned into a pull-up period put and a pull-down period pdt as illustrated in FIG. 8. The pull-up period put represents a period in which the Q node NQ as a pull-up node of the q-th stage STAq is charged with the gate-on voltage Von and the q-stage STAq outputs the gate-on voltage (Von). The pull-down period pdt represents a period in which the Q node NQ of the q-th stage STAq is discharged to the gate-off voltage Voff, the QB node NQB as a pull-down node is charged with the gate-on voltage Von, and the q-th stage STAq outputs the gate-off voltage Voff. The pull-up period put includes first to sixth periods t1 to t6 and the pull-down period pdt includes seventh to tenth periods t7 to t10.

When the pull-up transistor TU, the pull-down transistor TD, and the first to ninth transistors T1 to T9 are formed of P-type MOSFETs, the signals illustrated in FIG. 8 should be corrected to match the characteristics of the P-type MOSFETs.

The operation of the q-stage STAq in the pull-up period put will be described below in detail with reference to FIGS. 9A to 9F and the operation of the q-stage STAq in the pull-down period pdt will be described below in detail with reference to FIGS. 10A to 10D.

FIGS. 9A to 9F are diagrams illustrating the q-th stage in FIG. 7 in the first to sixth periods of the pull-up period. The operations of the q-th stage STAq in the first to sixth periods t1 to t6 of the pull-up period put will be specifically described with reference to FIG. 8 and FIGS. 9A to 9F.

In FIGS. 9A to 9F, the first start signal VST1 is input to the start terminal ST of the q-th stage STAq, the second start signal VST2 is input to the previous-stage output signal input terminal PT, the first clock signal CLK1 is input to the first clock terminal CT1, the seventh clock signal CLK7 is input to the second clock terminal CT2, the fifth clock signal CLK5 is input to the third clock terminal CT3, and the (q+3)-th gate signal GSq+3 is input to the subsequent-stage output signal input terminal NT.

Figure 9A:
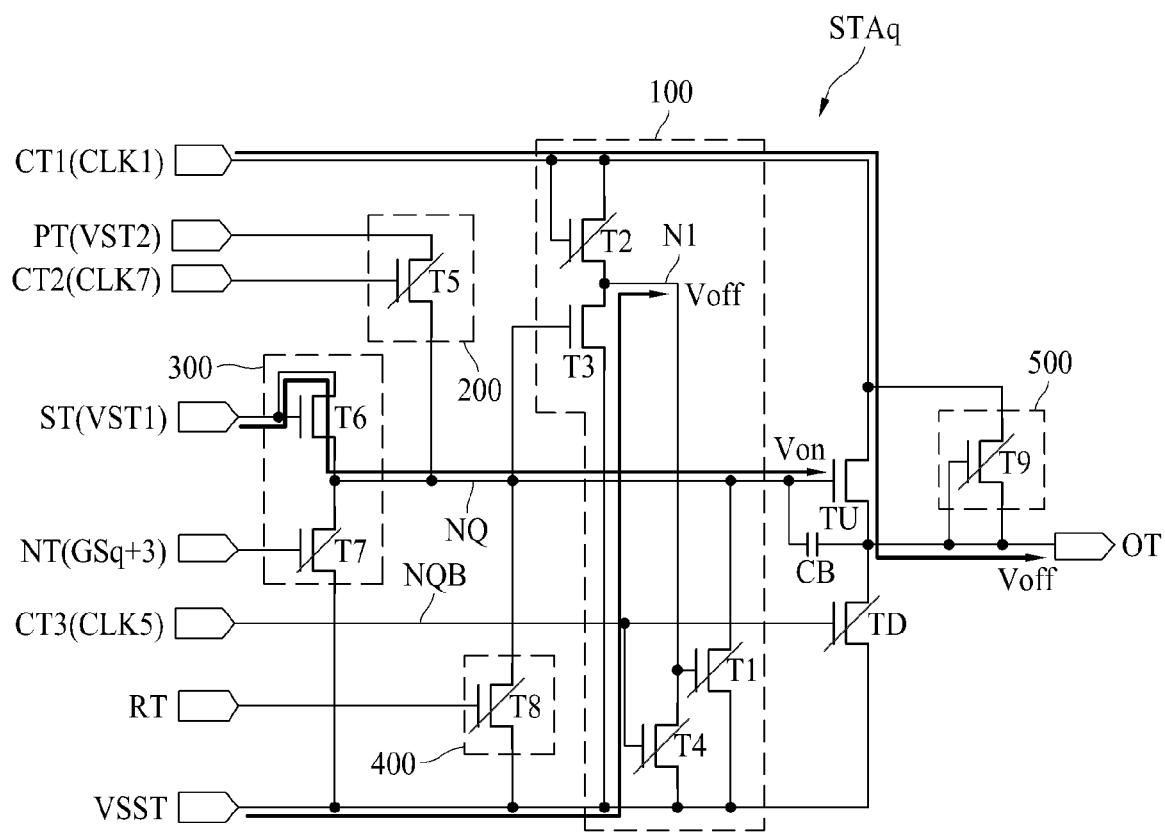
FIGS. 9A to 9F are diagrams illustrating a k-th stage in FIG. 4 in first to sixth periods of a pull-up period.

First, in the first period t1, the first start signal VST1 of the gate-on voltage Von is input to the start terminal ST. Accordingly, since the sixth transistor T6 is turned on in the first period t1, the gate-on voltage Von of the first start signal VST1 is supplied to the Q node NQ as illustrated in FIG. 9A.

In the first period t1, the third transistor T3 is turned on by the gate-on voltage Von of the Q node NQ and thus the first node N1 is connected to the first source voltage terminal VSST. Accordingly, the gate-off voltage Voff is supplied to the first node N1 as illustrated in FIG. 9A. In the first period t1, the pull-up transistor TU is turned on by the gate-on voltage Von of the Q node NQ and thus the output terminal OT is connected to the first clock terminal CT1. In the first period t1, since the first clock signal CLK1 of the gate-off voltage Voff is input to the first clock terminal CT1, the gate-off voltage Voff is output to the output terminal OT.

In the first period t1, the pull-down transistor TD and the first, second, fourth, fifth, and seventh to ninth transistors T1, T2, T4, T5, and T7 to T9 are turned off.

Figure 9B:
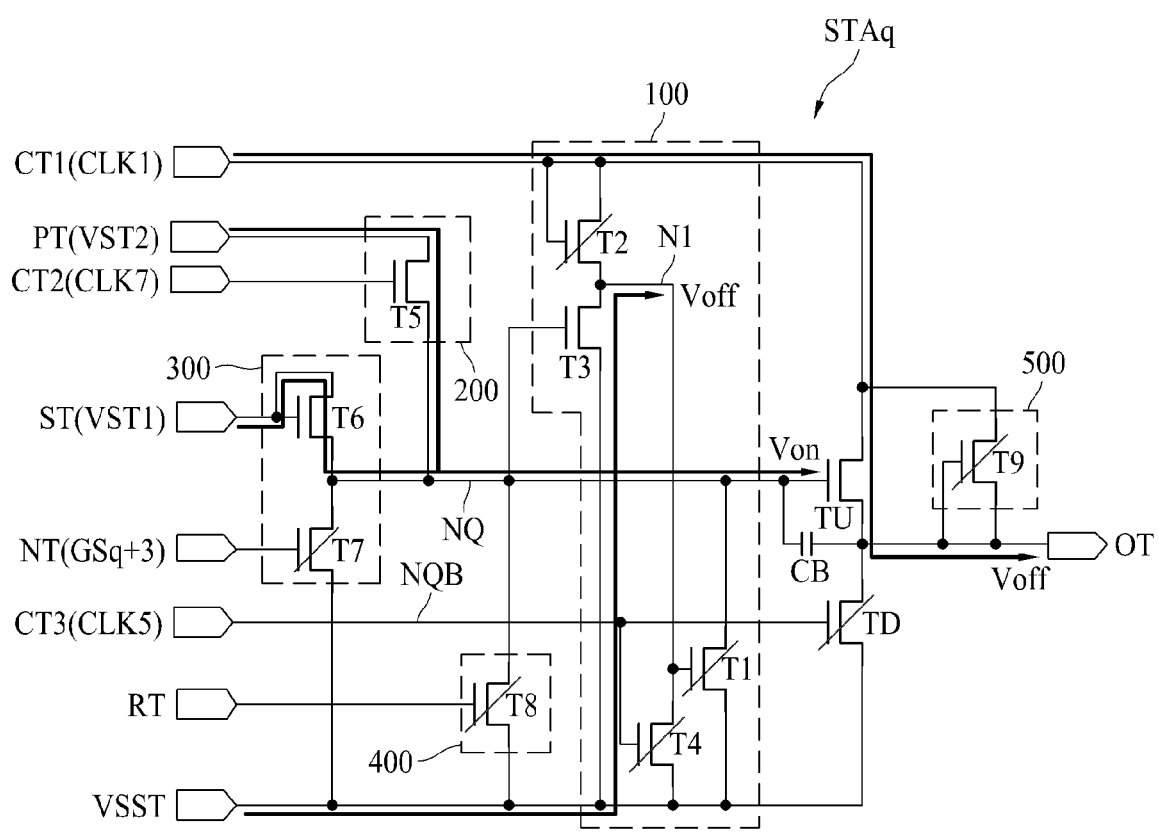

Second, in the second period t2, the first start signal VST1 of the gate-on voltage Von is input to the start terminal ST and the seven clock signal CLK7 of the gate-on voltage Von is input to the second clock terminal CT2. Accordingly, in the second period t2, since the fifth and sixth transistors T5 and T6 are turned on, the gate-on voltage Von of the first start signal VST1 and the gate-on voltage Von of the second start signal VST2 are supplied to the Q node NQ as illustrated in FIG. 9B.

In the second period t2, the third transistor T3 is turned on by the gate-on voltage Von of the Q node NQ and thus the first node N1 is connected to the first source voltage terminal VSST. Accordingly, the gate-off voltage Voff is supplied to the first node N1 as illustrated in FIG. 9B. In the second period t2, the pull-up transistor TU is turned on by the gate-on voltage Von of the Q node NQ and thus the output terminal OT is connected to the first clock terminal CT1. In the second period t2, since the first clock signal COLK1 of the gate-off voltage Voff is input to the first clock terminal CT1, the gate-off voltage Voff is output to the output terminal OT.

In the second period t2, the pull-down transistor TD and the first, second, fourth, and seventh to ninth transistors T1, T2, T3, and T7 to T9 are turned off.

Third, in the third period t3, the seventh clock signal CLK7 of the gate-on voltage Von is input to the second clock terminal CT2. Accordingly, in the third period t3, since the fifth transistor t5 is turned on, the gate-on voltage Von of the second start signal VST2 is supplied to the Q node NQ.

Figure 9C:
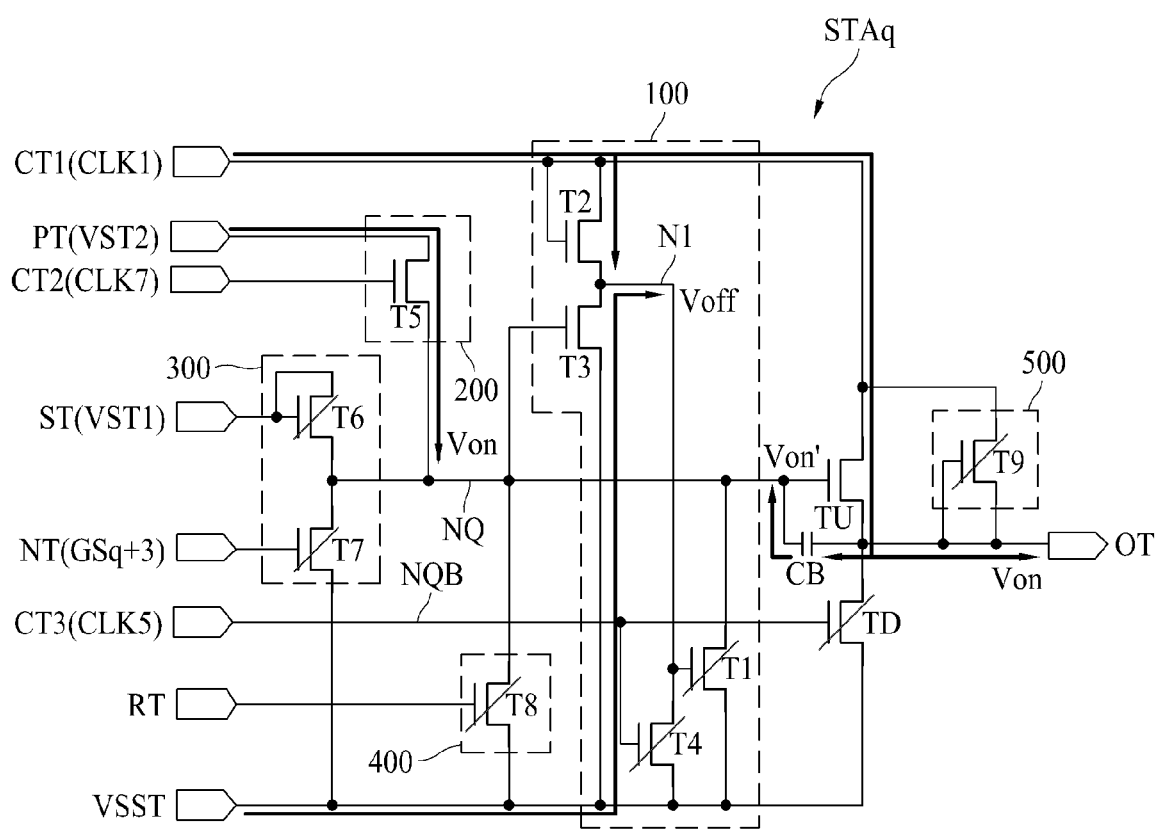

In the third period t3, the first clock signal CLK1 f the gate-on voltage is input to the first clock terminal CT1 and thus the second transistor T2 is turned on. In the third period t3, the third transistor T3 is turned on by the gate-on voltage Von of the Q node NQ. Accordingly, even when the second transistor is turned on, the first node N1 is connected to the first source voltage terminal VSST by the turning-on of the third transistor T3. As a result, the gate-off voltage Voff is supplied to the first node N1 as illustrated in FIG. 9C.

In the third period t3, the pull-up transistor TU is turned on by the gate-on voltage Von of the Q node NQ and thus the output terminal OT is connected to the first clock terminal CT1. Accordingly, in the third period t3, the gate-on voltage Von of the first clock signal CLK1 input to the first clock terminal CT1 is supplied to the output terminal OT.

On the other hand, since the voltage variation of the output terminal OT is boosted to the Q node NQ by the boosting capacitor CB, the voltage of the Q node NQ increases to a voltage Von' of a level higher than the gate-on voltage Von. In this case, since the pull-up transistor TU is completely turned on by the voltage Von' of the level higher than the gate-on voltage of the Q node NQ, the gate-on voltage Von of the first clock signal CLK1 can be stably output to the output terminal OT.

In the third period t3, the pull-down transistor TD and the first, fourth, sixth, and seventh to ninth transistors T1, T4, and T7 to T9 are turned off.

Figure 9D:
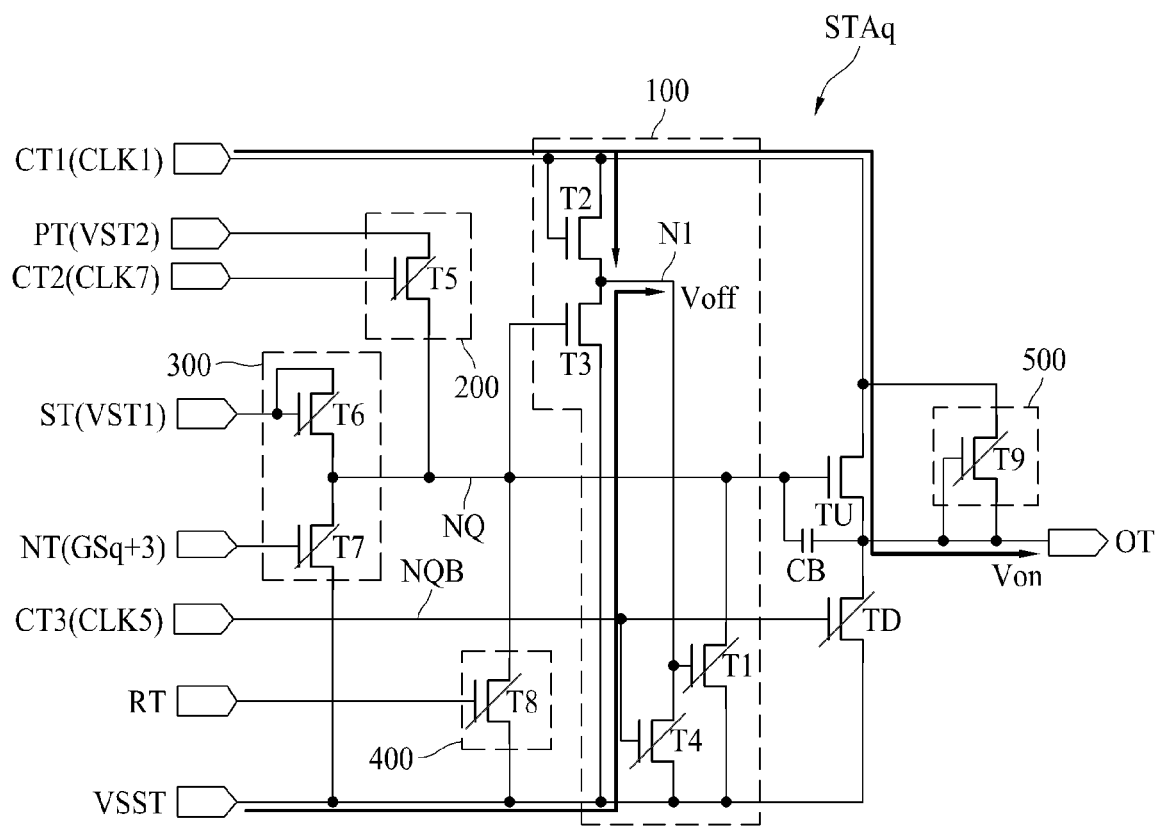
Figure 9E:
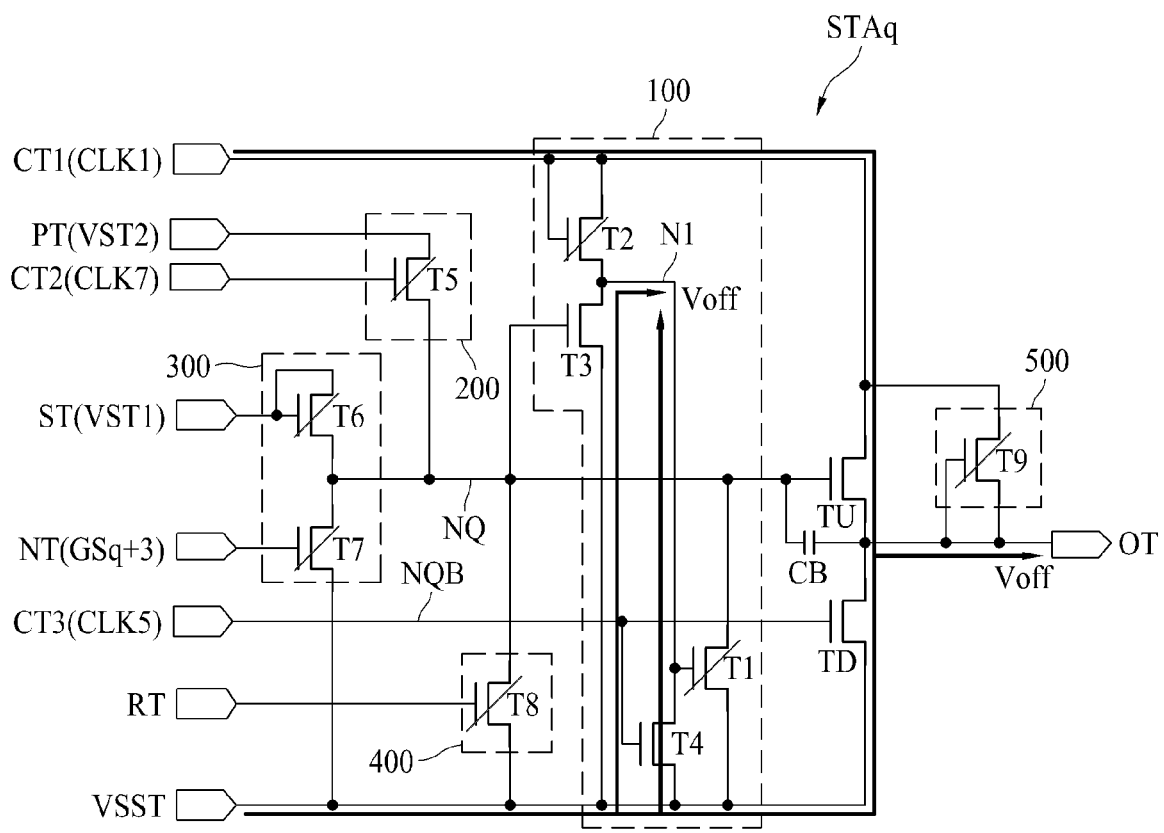

Fourth, in the fourth period t4, the first clock signal CLK1 of the gate-on voltage Von is input to the first clock terminal CT1 and thus the second transistor T2 is turned on. In the fourth period t4, since the Q node NQ maintains the voltage Von' of the level higher than the gate-on voltage Von by the boosting capacitor CB, the third transistor T3 is turned on. Even when the second transistor T2 is turned on, the first node N1 is connected to the first source voltage terminal VSST by the turning-on of the third transistor T3. Accordingly, the gate-off voltage Voff is supplied to the first node N1 as illustrated in FIG. 9D.

In the fourth period t4, since the Q node NQ maintains the voltage Von' of the level higher than the gate-on voltage Von by the boosting capacitor CB, the pull-up transistor TU can be completely turned on by the voltage Von' of the level higher than the gate-on voltage Von of the Q node NQ. Accordingly, the gate-on voltage Von of the first clock signal CLK1 can be stably output to the output terminal OT.

In the fourth period t4, the pull-down transistor TD and the first and fourth to ninth transistors T1 and T4 to T9 are turned off.

Fifth, in the fifth period t5, the fifth clock signal CLK5 of the gate-on voltage Von is input to the third clock terminal CT3 and thus the pull-down transistor TD and the fourth transistor T4 are turned on. Since the output terminal OT is connected to the first source voltage terminal by the turning-on of the pull-down transistor TD, the gate-off voltage Voff is supplied to the output terminal OT. Since the first node N1 is connected to the first source voltage terminal VSST by the turning-on of the fourth transistor T4, the gate-off voltage Voff is supplied to the first node N1.

On the other hand, since the voltage of the output terminal OT decreases from the gate-on voltage Von to the gate-off voltage Voff, the voltage VQ of the Q node NQ decreases from the voltage Von' of the level higher than the gate-on voltage Von to the gate-on voltage Von by the boosting capacitor CB. The pull-up transistor TU is turned on by the gate-on voltage Von of the Q node NQ and the gate-off voltage Voff of the first clock signal CLK1 input to the first clock terminal CT1 is output to the output terminal OT. The third transistor T3 is turned by the gate-on voltage Von of the Q node NQ. Since the first node N1 is connected to the first source voltage terminal VSST by the turning-on of the third transistor T3, the gate-off voltage Voff is supplied to the first node N1.

In the fifth period t5, the first, second, and fifth to ninth transistors T1, T2, and T5 to T9 are turned off.

Figure 9F:
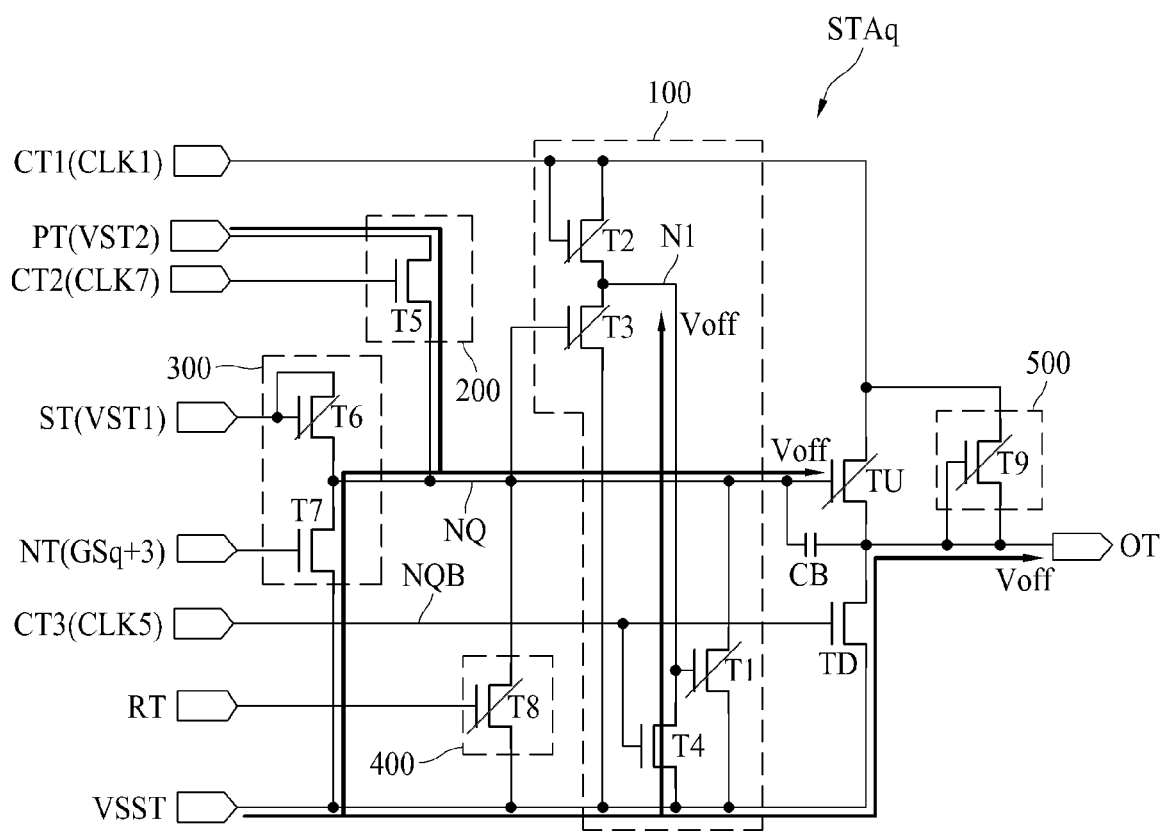
Figure 10A:
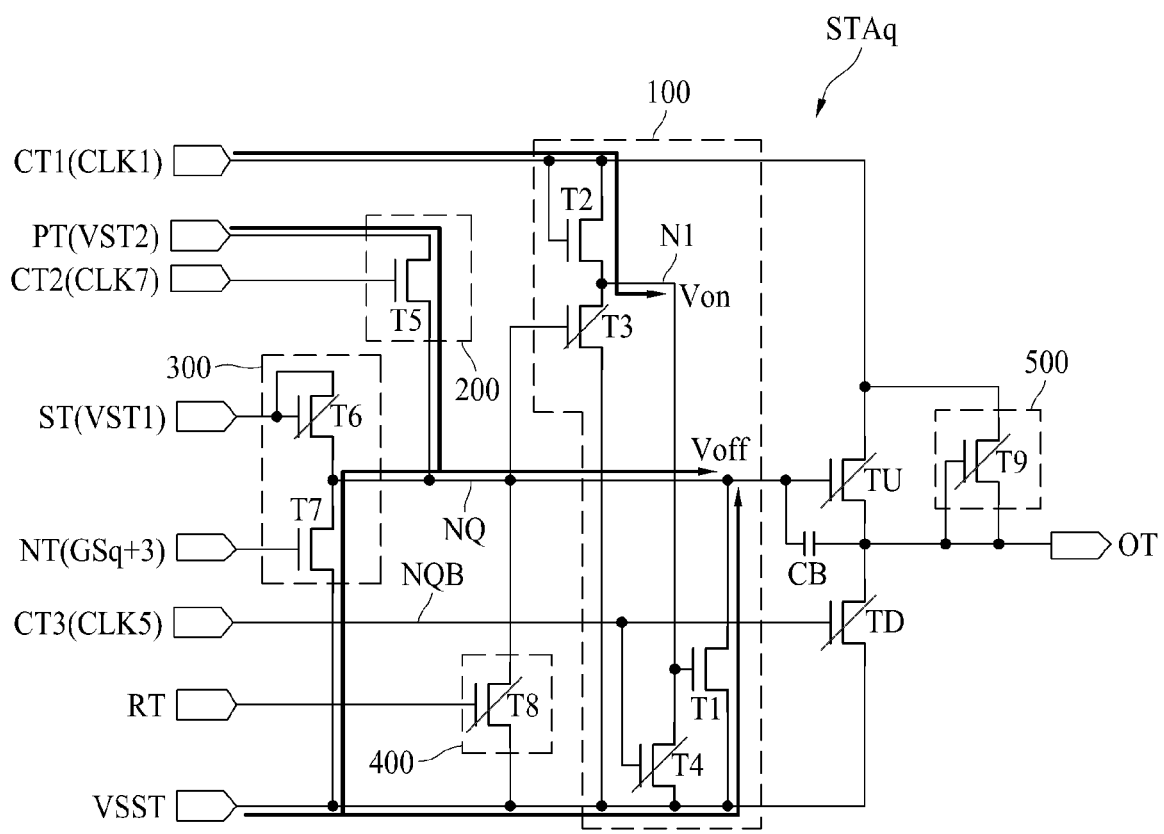
FIGS. 10A to 10D are diagrams illustrating the k-stage in FIG. 4 in seventh to tenth periods of a pull-down period.
Figure 10B:
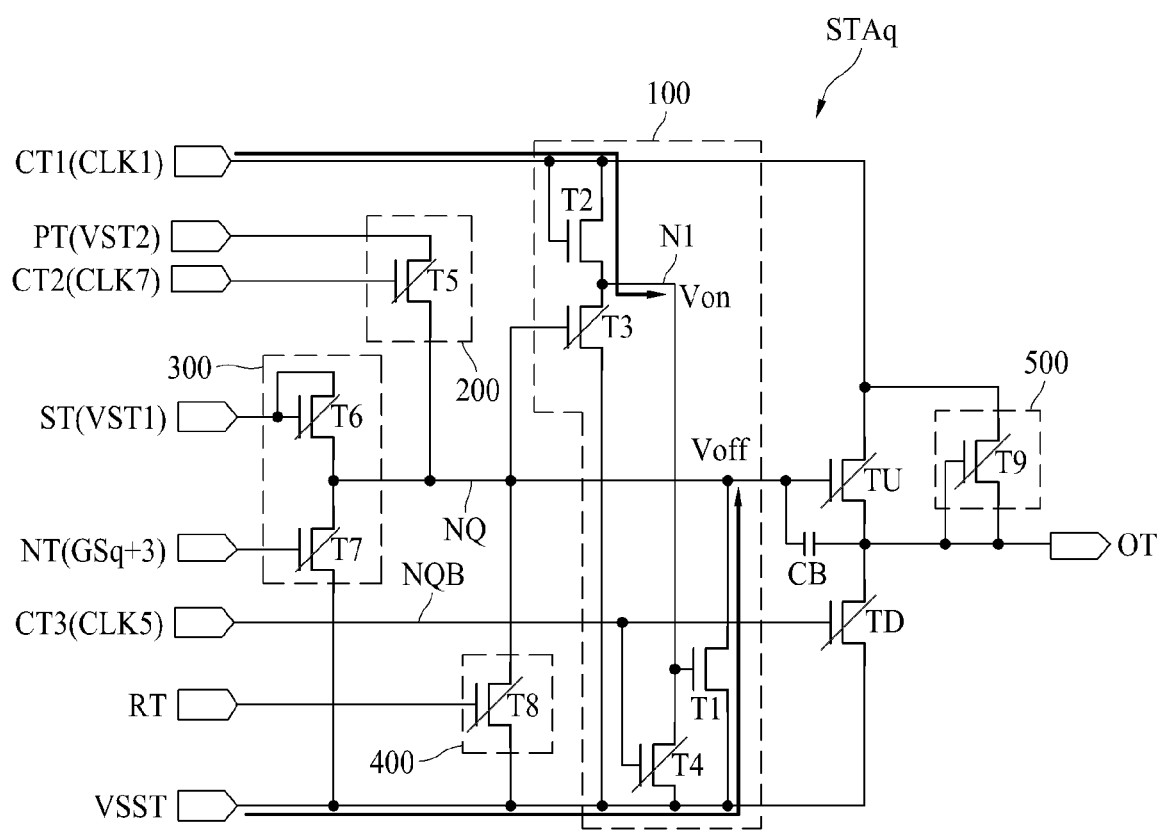
Figure 10C:
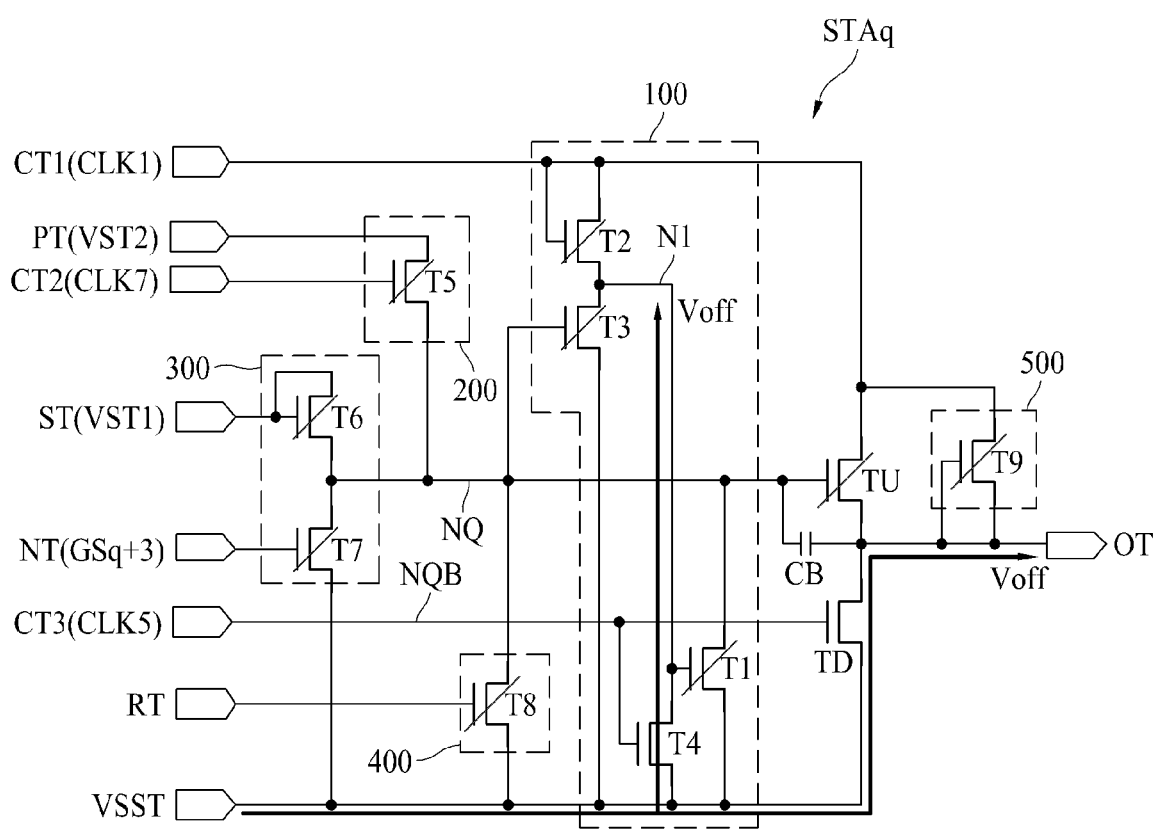
Figure 10D:
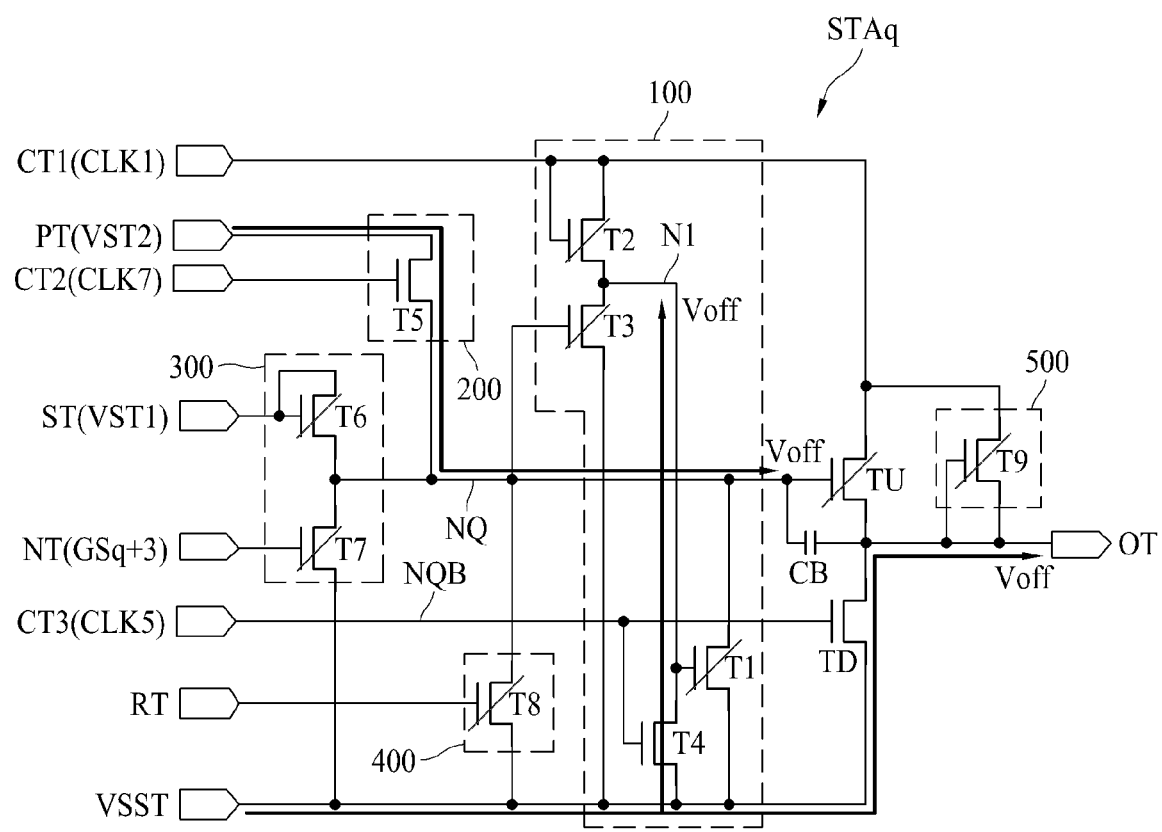

Sixth, in the sixth period t6, the gate signal GSq+3 of the (q+3)-th stage STAq+3 of the gate-on voltage Von is input to the subsequent-stage output signal input terminal NT and the seventh clock signal CLK7 of the gate-on voltage Von is input to the second clock terminal CT2. Accordingly, in the sixth period t6, since the fifth and seventh transistors T5 and T7 are turned on, the gate-off voltage Voff is supplied to the Q node NQ as illustrated in FIG. 9F.

In the sixth period t6, the fifth clock signal CLK5 of the gate-on voltage Von is input to the third clock terminal CT3 and thus the pull-down transistor TD and the fourth transistor T4 are turned on. Since the output terminal OT is connected to the first source voltage terminal by the turning-on of the pull-down transistor TD, the gate-off voltage Voff is supplied to the output terminal OT. Since the first node N1 is connected to the first source voltage terminal VSST by the turning-on of the fourth transistor T4, the gate-off voltage Voff is supplied to the first node N1.

In the sixth period t6, the pull-up transistor TU and the first to third, sixth, eighth, and ninth transistors T1, T2, T3, T6, T8, and T9 are turned off.

As described above, the q-th stage STAq according to the embodiment of the present invention can output the gate-on voltage Von to the output terminal OT in the third and fourth periods t3 and t4 of the pull-up period put.

Figure 4:
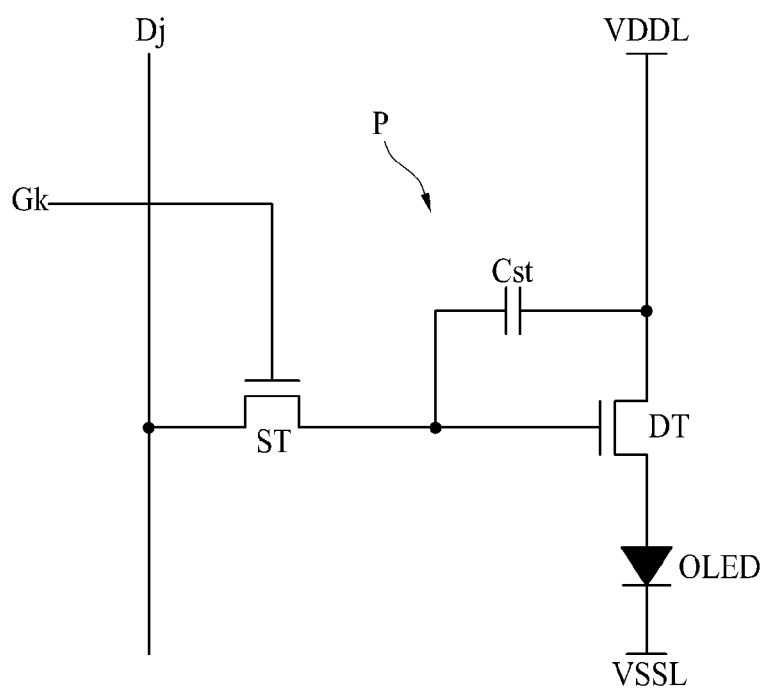
FIG. 4 is a diagram illustrating another example of a pixel in FIG. 2.

FIGS. 10A to 10D are diagrams illustrating the k-th stage in FIG. 4 in the seventh to tenth periods of the pull-down period. The operations of the q-th stage STAq in the seventh to tenth periods t7 to t10 of the pull-down period pdt will be specifically described with reference to FIG. 8 and FIGS. 10A to 10D.

In FIGS. 10A to 10D, the first start signal VST1 is input to the start terminal ST of the q-th stage STAq, the second start signal VST2 is input to the previous-stage output signal input terminal PT, the first clock signal CLK1 is input to the first clock terminal CT1, the seventh clock signal CLK7 is input to the second clock terminal CT2, the fifth clock signal CLK5 is input to the third clock terminal CT3, and the (q+3)-th gate signal GSq+3 is input to the subsequent-stage output signal input terminal NT.

First, in the seventh period t7, the first clock signal CLK1 of the gate-on voltage Von is input to the first clock terminal CT1. Accordingly, the second transistor T2 is turned on and the gate-on voltage Von is supplied to the first node N1. In this case, since the first transistor T1 is turned on, the Q node NQ is connected to the first source voltage terminal VSST. Accordingly, the gate-off voltage Voff is supplied to the Q node NQ.

The seventh clock signal CLK7 of the gate-on voltage Von is input to the second clock terminal CT2. Accordingly, since the fifth transistor T5 is turned on, the Q node NQ is connected to the previous-stage output signal input terminal PT. As a result, the gate-off voltage Voff of the second start signal VST2 is supplied to the Q node NQ.

In the seventh period t7, the (q+3)-th gate signal of the gate-on voltage Von of the (q+3)-th stage STAq+3 is input to the subsequent-stage output signal input terminal NT. Accordingly, since the seventh transistor T7 is turned on, the Q node NQ is connected to the first source terminal VSST. As a result, the gate-off voltage Voff is supplied to the Q node NQ. On the other hand, in the other pull-down period pdt other than the seventh period t7, since the (q+3)-th gate signal of the gate-off voltage Voff is input, it should be noted that the seventh transistor T7 is turned off.

In the seventh period t7, the pull-up transistor TU, the pull-down transistor TD, and the third, fourth, sixth, eighth, and ninth transistors T3, T4, T6, T8, and T9 are turned off.

As a result, in the seventh period T7, the discharge potential of the Q node NQ can be stably maintained at the gate-low voltage Voff by the first transistor T1 of the first noise removing unit 100 and the fifth transistor T5 of the second noise removing unit 200.

Second, in the eighth period t8, the first clock signal CLK1 of the gate-on voltage Von is input to the first clock terminal CT1. Accordingly, the second transistor T2 is turned on and the gate-on voltage Von is supplied to the first node N1. In this case, since the first transistor T1 is turned on, the Q node NQ is connected to the first source voltage terminal VSST. Accordingly, the gate-off voltage Voff is supplied to the Q node NQ.

In the eighth period t8, the pull-up transistor TU, the pull-down transistor TD, and the third to ninth transistors T3 to T9 are turned off.

As a result, in the eighth period t8, the discharge potential of the Q node NQ can be stably maintained at the gate-low voltage Voff by the first transistor T1 of the first noise removing unit 100.

Third, in the ninth period t9, the fifth clock signal CLK5 of the gate-on voltage Von is input to the third clock terminal CT3 and thus the pull-down transistor TD and the fourth transistor T4 are turned on. Since the output terminal OT is connected to the first source voltage terminal by the turning-on of the pull-down transistor TD, the gate-off voltage Voff is supplied to the output terminal OT. Since the first node N1 is connected to the first source voltage terminal VSST by the turning-on of the fourth transistor T4, the gate-off voltage Voff is supplied to the first node N1.

In the ninth period t9, the pull-up transistor TU and the first to third and fifth to ninth transistors T1, T2, T3, T5 to T9 are turned off.

Fourth, in the tenth period t10, the fifth clock signal CLK5 of the gate-on voltage Von is input to the third clock terminal CT3 and thus the pull-down transistor TD and the fourth transistor T4 are turned on. Since the output terminal OT is connected to the first source voltage terminal by the turning-on of the pull-down transistor TD, the gate-off voltage Voff is supplied to the output terminal OT. Since the first node N1 is connected to the first source voltage terminal VSST by the turning-on of the fourth transistor T4, the gate-off voltage Voff is supplied to the first node N1.

In the tenth period t10, the seventh clock signal CLK7 of the gate-on voltage Von is input to the second clock terminal CT2. Accordingly, since the fifth transistor t5 is turned on, the Q node NQ is connected to the previous-stage output signal input terminal PT. As a result, the gate-on voltage Von of the second start signal VST2 is supplied to the Q node NQ.

In the tenth period t10, the pull-up transistor TU and the first to third and sixth to ninth transistors T1, T2, T3, T6 to T9 are turned off.

As a result, in the tenth period T10, the discharge potential of the Q node NQ can be stably maintained at the gate-low voltage Voff by the fifth transistor T5 of the second noise removing unit 200.

The seventh to tenth periods t7 to 10 of the pull-down period pdt can be repeated up to the next pull-up period put.

As described above, in the embodiment of the present invention, in the seventh, eighth, and tenth periods t7, t8, and t10, the noise of the Q node NQ can be removed using the first and second noise removing units 100 and 200. Specifically, the seventh and eighth periods t7 and t8 are periods in which the noise of the Q node NQ is removed using the first noise removing unit 100, and the seventh and tenth periods t7 and t10 are periods in which the noise of the Q node NQ is removed using the second noise removing unit 200.

Particularly, a parasitic capacitor can be formed between the gate electrode and the second electrode of the pull-up transistor TU. In this case, when the first clock signal CLK1 is switched from the gate-off voltage Voff to the gate-on voltage Von, the Q node NQ can be affected by the first clock signal CLK1 due to the parasitic capacitor. Accordingly, ripples or noise may be included in the Q node NQ. However, in the embodiment of the present invention, in the period in which the first clock signal CLK1 is input as the gate-on voltage Von in the pull-down period pdt, since the gate-off voltage Voff is supplied to the Q node NQ using the first transistor T1 of the first noise removing unit 100, it is possible to remove the noise of the Q node NQ. As a result, in the embodiment of the present invention, since the discharge potential of the Q node NQ can be stably maintained in the pull-down period pdt, it is possible to prevent an abnormal output of the gate-on voltage from the stages.

Figure 11A:
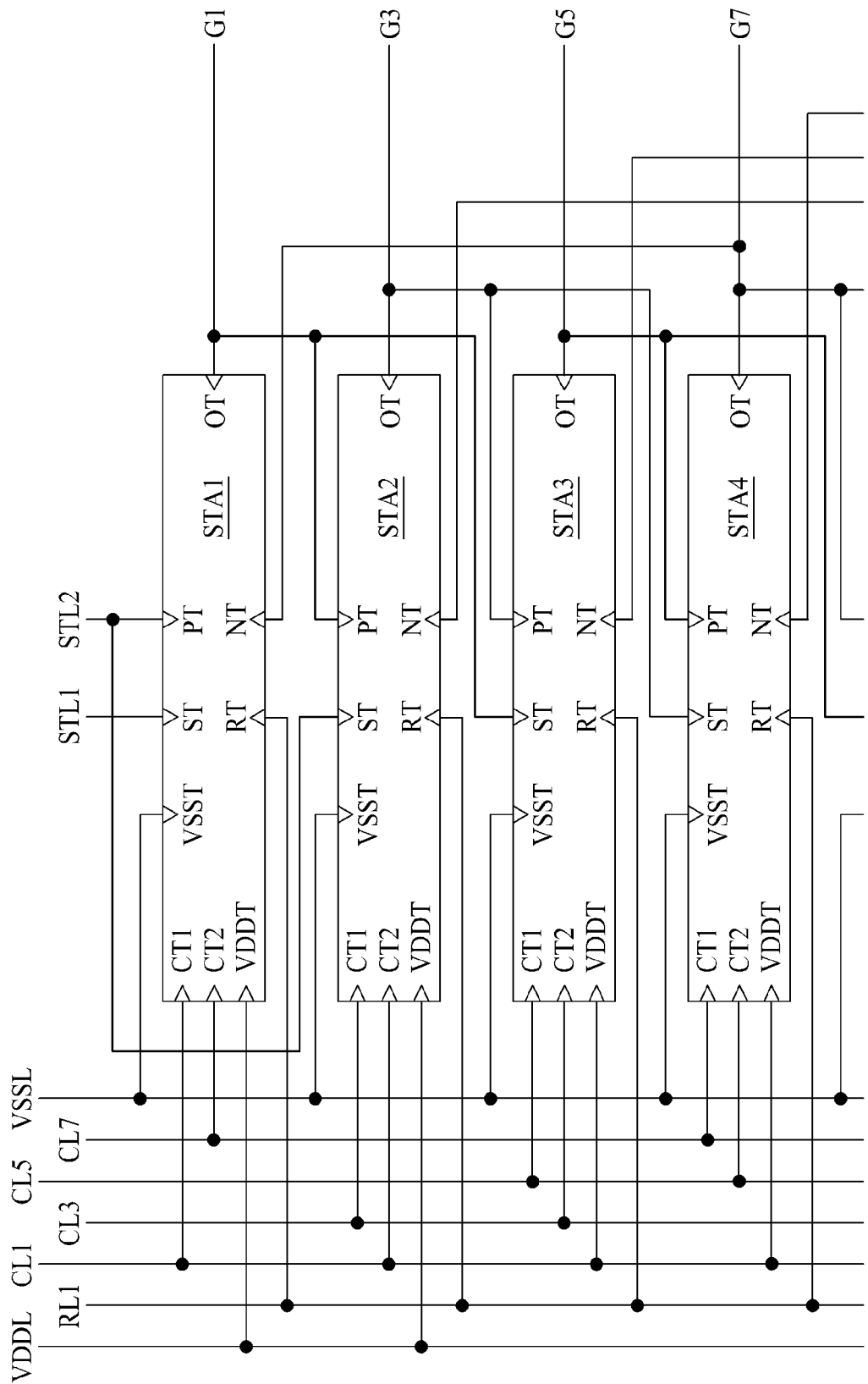
FIG. 11A is a block diagram illustrating another example of the first gate driver in FIG. 2.

FIG. 11A is a block diagram illustrating another example of the first gate driver in FIG. 2. Referring to FIG. 11A, the first gate driver 11 is provided with a first start signal line STL1 supplied with a first start signal, a second start signal line STL2 supplied with a second start signal, a first reset line RL1 supplied with a first reset signal, first, third, fifth, and seventh clock lines CL1, CL3, CL5, and CL7 supplied with first, third, fifth, and seventh clock signals, a first source voltage line VSSL supplied with a first source voltage as a DC voltage, and a second source voltage line VDDL supplied with a second source voltage as another DC voltage. The first and second start signals, the first reset signal, and the first, third, fifth, and seventh clock signals are supplied from the timing controller 30 in FIG. 1 and the first source voltage and the second source voltage can be supplied from a voltage source (not illustrated). The first source voltage may be a gate-off voltage and the second source voltage may be a gate-on voltage.

The first gate driver 11 includes stages STA1 to STAp connected to the odd-numbered gate lines G1, G3, . . . , Gn+1. In FIG. 11A, for the purpose of convenience of explanation, only the first to fourth stages STA1 to STA4 connected to the first, third, fifth, and seventh gate lines G1, G3, G5, and G7 are illustrated.

Each of the stages STA1 to STAp of the first gate driver 11 includes a start terminal ST, a reset terminal RT, a previous-stage carrier signal input terminal PT, a subsequent-stage carrier signal input terminal NT, a first and second clock terminals CT1 and CT2, a first source voltage terminal VSST, a second source voltage terminals VDDT, and an output terminal OT.

The second source voltage terminal VDDT of the stages STA1 to STAq is connected to the second source voltage line VDDL. The second source voltage is supplied to the second source voltage terminal VDDT of each of the stages STA1 to STAq.

On the other hand, the stages STA1 to STAq of the gate driver 11 illustrated in FIG. 11A are substantially the same as the stages STA1 to STAq of the first gate driver 11 described above with reference to FIG. 6A, except that the second source voltage terminal VDDT is included instead of the third clock terminal CT3. Accordingly, detailed description of the start terminal ST, the reset terminal RT, the previous-stage output signal input terminal PT, the subsequent-stage output signal input terminal NT, the first and second clock terminals CT1 and CT2, the first source voltage terminal VSST, and the output terminal OT of each of the stages STA1 to STAq of the first gate driver 11 illustrated in FIG. 11A will not be repeated.

Figure 11B:
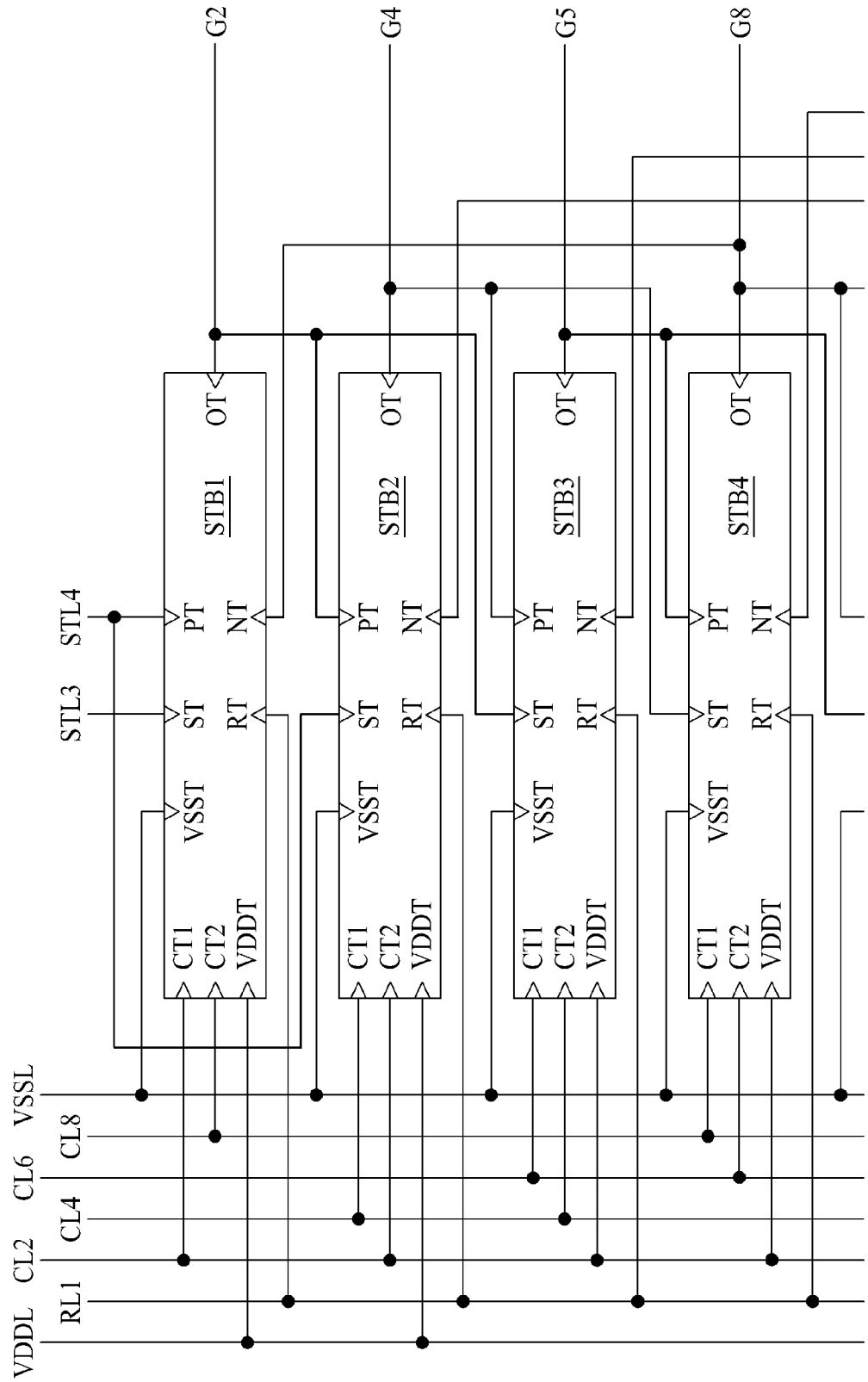
FIG. 11B is a block diagram illustrating another example of the second gate driver in FIG. 2.

FIG. 11B is a block diagram illustrating another example of the second gate driver in FIG. 2. Referring to FIG. 11B, the second gate driver 12 is provided with a third start signal line STL3 supplied with a third start signal, a fourth start signal line STL4 supplied with a fourth start signal, a second reset line RL2 supplied with a second reset signal, second, fourth, sixth, and eighth clock lines CL2, CL4, CL6, and CL8 supplied with second, fourth, sixth, and eighth clock signals which are even-numbered clock signals, a first source voltage line VSSL supplied with a first source voltage as a DC voltage, and a second source voltage line VDDL supplied with a second source voltage as another DC voltage. The third and fourth start signals, the second reset signal, and the second, fourth, sixth, and eighth clock signals are supplied from the timing controller 30 in FIG. 1 and the first source voltage and the second source voltage can be supplied from a voltage source (not illustrated). The first source voltage may be a gate-off voltage and the second source voltage may be a gate-on voltage.

The second gate driver 12 includes stages STB1 to STBp connected to the even-numbered gate lines G2, G4, ..., Gn. In FIG. 11B, for the purpose of convenience of explanation, only the first to fourth stages STB1 to STB4 connected to the second, fourth, sixth, and eighth gate lines G2, G4, G6, and G8 are illustrated.

The stages STB1 to STBp of the second gate driver 12 are substantially the same as the stages STA1 to STAp of the first gate driver 11 described above with reference to FIG. 11A, except that the first and second start signal lines STL1 and STL2, and the first reset line RL1, the first, third, fifth, and seventh clock lines CL1, CL3, CL5, and CL7 are replaced with the third and fourth start signal liens STL3 and STL4, the second reset line RL2, and the second, fourth, sixth, and eighth clock lines CL2, CL4, CL6, and CL8. Accordingly, detailed description of the stages STB1 to STBp of the second gate driver 12 will not be repeated.

Figure 12:
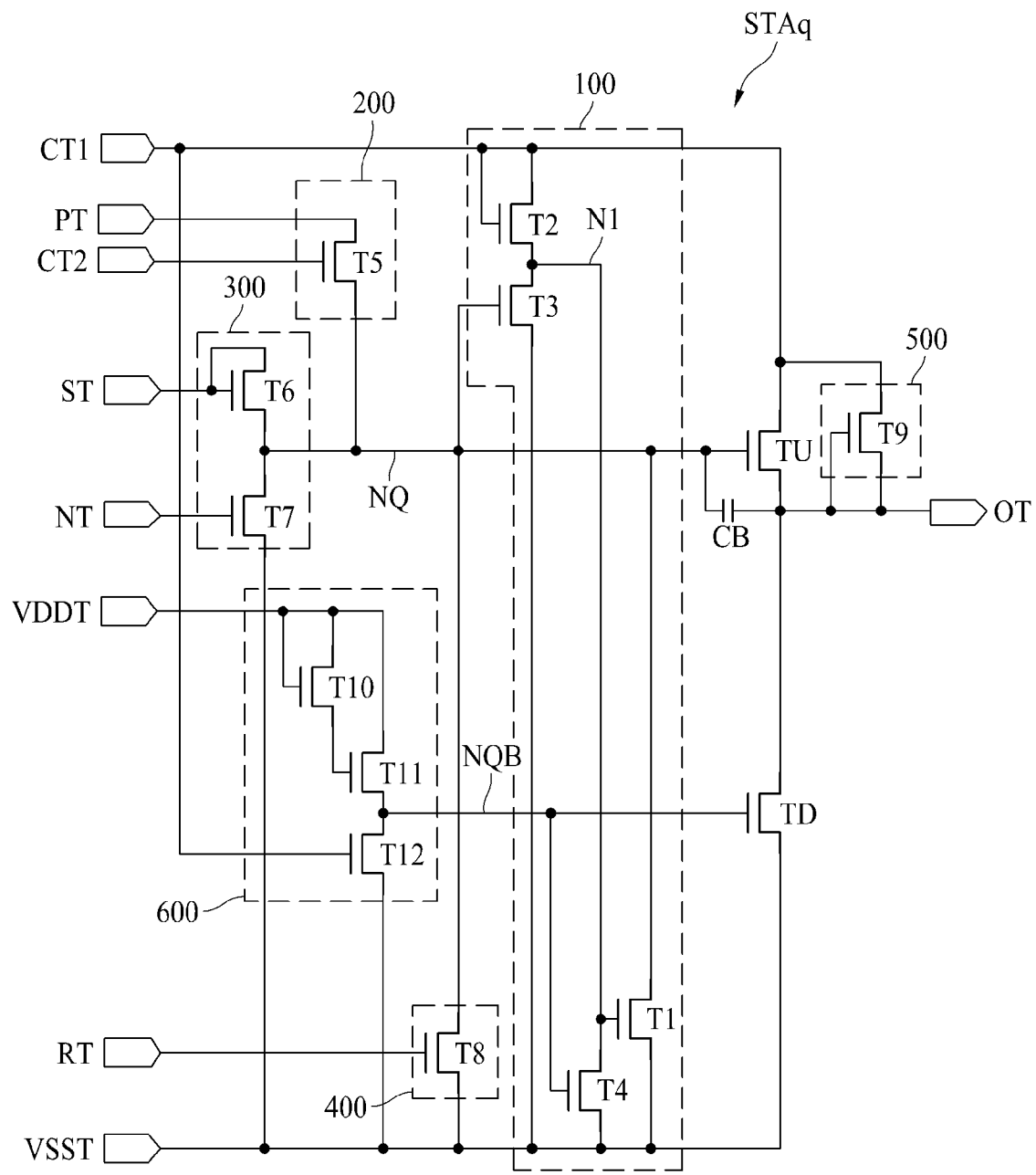
FIG. 12 is a circuit diagram illustrating another example of the q-th stage of the first gate driver.

FIG. 12 is a circuit diagram illustrating another example of the q-stage of the first gate driver. In FIG. 12, for the purpose of convenience of explanation, it is assumed that the pull-up node is a Q node NG and the pull-down node is a QB node NGB.

Referring to FIG. 12, the q-th stage STAq of the first gate driver 11 includes a pull-up transistor TU, a pull-down transistor TD, a first noise removing unit 100, a second noise removing unit 200, a Q node charging and discharging unit 300, a Q node reset unit 400, an output terminal noise removing unit 500, a QB node charging and discharge unit 600, and a boosting capacitor CB.

The pull-up transistor TU, the pull-down transistor TD, the first noise removing unit 100, the second noise removing unit 200, the Q node charging and discharging unit 300, the Q node reset unit 400, the output terminal noise removing unit 500, and the boosting capacitor CB of the q-th stage STAq illustrated in FIG. 12 are substantially the same as the pull-up transistor TU, the pull-down transistor TD, the first noise removing unit 100, the second noise removing unit 200, the Q node charging and discharging unit 300, the Q node reset unit 400, the output terminal noise removing unit 500, and the boosting capacitor CB illustrated in FIG. 7. Accordingly, detailed description of the pull-up transistor TU, the pull-down transistor TD, the first noise removing unit 100, the second noise removing unit 200, the Q node charging and discharging unit 300, the Q node reset unit 400, the output terminal noise removing unit 500, and the boosting capacitor CB illustrated in FIG. 12 will not be repeated.

The QB node charging and discharge unit 600 charges the QB node NQB with the second source voltage input to the second source voltage terminal VDDT and discharges the QB node NQB in response to the clock signal input to the first clock terminal CLK1. The QB node charging and discharge unit 600 includes tenth to twelfth transistors T10 to T12.

The gate electrode and the second electrode of the tenth transistor T10 are connected to the second source voltage terminal VDDT and the first electrode thereof is connected to the gate electrode of the eleventh transistor T11. That is, the tenth transistor T10 is diode-connected. The tenth transistor T10 is turned on to supply the gate-on voltage to the gate electrode of the eleventh transistor T11 by the gate-on voltage of the second source voltage terminal VDDT. In the following description, it is assumed that the second source voltage input to the second source voltage terminal VDDT is the gate-on voltage.

The gate electrode of the eleventh transistor T11 is connected to the first electrode of the tenth transistor T10, the first electrode thereof is connected to the QB node NQB, and the second electrode thereof is connected to the second source voltage terminal VDDT. The eleventh transistor T11 is turned to connect the QB node NQB to the second source voltage terminal VDDT by the gate-on voltage of the second source voltage terminal VDDT supplied via the tenth transistor T10. When the eleventh transistor T11 is turned on, the gate-on voltage is supplied to the QB node NQB and thus the pull-down transistor TD is turned on.

The gate electrode of the twelfth transistor T12 is connected to the first clock terminal CT1, the first electrode thereof is connected to the first source voltage terminal VSST, and the second electrode thereof is connected to the QB node NQB. The twelfth transistor T12 is turned on to connect the QB node NQB to the first source voltage terminal VSST by the gate-on voltage of the clock signal input to the first clock terminal CT1. When the twelfth transistor T12 is turned on, the gate-off voltage is supplied to the QB node NQB and thus the pull-down transistor TD is turned off.

As described above, in the embodiment of the present invention, the QB node NQB is charged with the gate-on voltage Von using the QB node charging and discharge unit 600, except for the period in which the clock signal of the gate-on voltage is input to the first clock terminal CT1.

On the other hand, in the display device according to the embodiment of the present invention, when the display device is driven in a low refresh rate or a variable refresh rate or is driven in a stop & stop manner to reduce power consumption, the blank period BP is elongated. The clock signal input to the third clock terminal CT3 of the q-th stage STAq illustrated in FIG. 7 is not input in the blank period. Accordingly, when the blank period BP is elongated, the period in which the pull-down transistor TD is not turned on is also elongated. As a result, the period in which the gate-off voltage Voff is not supplied to the gate lines is elongated. In this case, there is a problem in that the gate lines are not maintained at the gate-off voltage Voff due to noise or the like.

However, in the q-th stage STAq illustrated in FIG. 11A and FIG. 11B, the QB node NQB is charged with the gate-on voltage Von using the QB node charging and discharge unit 600, except for the period in which the clock signal of the gate-on voltage is input to the first clock terminal CT1. Accordingly, in the embodiment of the present invention, the pull-down transistor TD can be turned on regardless of the blank period BP to stably supply the gate-off voltage Voff to the gate lines. As a result, when the blank period BP is elongated by driving the display device in a low refresh rate or a variable refresh rate or driving the display device in a stop & stop manner so as to reduce power consumption, it is possible to solve the problem in that the gate lines are not maintained at the gate-off voltage Voff due to noise or the like.

The start signal VST1 input to the start terminal ST of the q-th stage STAq, the second start signal VST2 input to the previous-stage output signal input terminal PT, the first, third, fifth, and seventh clock signals CLK1, CLK3, CLK5, and CLK7, the voltage VQ of the Q node NQ, the voltage VN1 of the first node N1, and the q-th to (q+3)-th gate signals GSq, GSq+1, GSq+2, and GSq+3 which are illustrated in FIG. 11A and FIG. 11B are substantially the same as illustrated in FIG. 8.

The operation of the q-th stage STAq in the pull-up period put illustrated in FIG. 11A and FIG. 11B are substantially the same as described above with reference to FIGS. 9A to 9F.

Accordingly, the operation of the q-th stage STAq in the pull-up period put illustrated in FIG. 11A and FIG. 11B will not be repeated.

The operation of the q-th stage STAq in the pull-down period pdt illustrated in FIG. 11A and FIG. 11B are substantially the same as described above with reference to FIGS. 10A to 10D. Accordingly, the operation of the q-th stage STAq in the pull-down period pdt illustrated in FIG. 11A and FIG. 11B will not be repeated.

As described above, according to the embodiment of the present invention, the noise of the pull-up node is removed using the plural noise removing units. As a result, according to the embodiment of the present invention, even when the threshold voltage of the transistor of one noise removing unit is negatively shifted, the noise of the pull-up node can be removed using the other noise removing unit. Accordingly, according to the embodiment of the present invention, since the discharge potential of the pull-up node can be stably maintained, it is possible to prevent an abnormal output of a gate-on voltage from a stage.

According to the embodiment of the present invention, the pull-down node is charged with the gate-on voltage using the pull-down node charging and discharge unit, except for the period in which the clock signal of the gate-on voltage is input to the first clock terminal. Accordingly, in the embodiment of the present invention, the pull-down transistor can be turned on regardless of the blank period to stably supply the gate-off voltage to the gate lines. As a result, according to the embodiment of the present invention, when the blank period BP is elongated by driving the display device in a low refresh rate or a variable refresh rate or driving the display device in a stop & stop manner so as to reduce power consumption, it is possible to solve the problem in that the gate lines are not maintained at the gate-off voltage Voff due to noise or the like.

It will be apparent to those skilled in the art that various modifications and variations can be made in the gate driver and display device using he same of the present invention. Thus it is intended that the present invention cover the modifications and variations of this invention provided they come within the scope of the appended claims.

What is claimed is:

1. A gate driver comprising a plurality of stages, wherein a stage of the plurality of stages includes:
   a pull-up transistor that outputs a clock signal input to a first clock terminal to an output terminal depending on a voltage of a pull-up node;
   a pull-down transistor that outputs a first source voltage input to a first source voltage terminal to the output terminal depending on a voltage of a pull-down node; and
   a first noise removing unit that supplies a gate-off voltage to the pullup node to remove noise of the pull-up node in response to the clock signal input to the first clock terminal,
   wherein the first noise removing unit includes:
   a first transistor turned on in response to a gate-on voltage of a first node and supply the first source voltage of the first source voltage terminal to the pull-up node; and
   a second transistor turned on in response to the gate-on voltage of the clock signal input to the first clock terminal and supply a gate-on voltage of the clock signal to the gate electrode of the first transistor.

2. The gate driver according to claim 1, wherein the first noise removing unit further includes a third transistor turned on in response to the gate-on voltage of the pull-up node and supply the first source voltage of the first source voltage terminal to the first node.

3. The gate driver according to claim 2, wherein the first noise removing unit further includes a fourth transistor turned on in response to the gate-on voltage of the pull-down node and supply the first source voltage of the first source voltage terminal to the first node.

4. The gate driver according to claim 1, wherein the stage further includes a second noise removing unit including a fifth transistor turned on in response to a gate-on voltage of another clock signal input to a second clock terminal and connect the pull-up node to a previous-stage output signal input terminal.

5. The gate driver according to claim 1, wherein the stage further includes:
   a pull-up node charging and discharging unit charging the pull-up node with a gate-on voltage depending on a signal input to a start terminal or discharging the pull-up node to the gate-off voltage depending on a signal input to a subsequent stage output signal input terminal;
   a pull-up node reset unit resetting the pull-up node in response to a reset signal input to a reset terminal; and
   an output terminal noise removing unit removing noise of the output terminal.

6. The gate driver according to claim 5, wherein the pull-up node charging and discharging unit includes:
   a sixth transistor turned on in response to the gate-on voltage of the signal input to the start terminal and supply the pull-up node with a gate-on signal of the signal input to the start terminal; and
   a seventh transistor turned on in response to a gate-on voltage of the signal input to the subsequent-stage output signal input terminal and supply the pull-up node with the first source voltage of the first source voltage terminal.

7. The gate driver according to claim 5, wherein the pull-up node reset unit includes an eighth transistor turned on in response to a gate-on voltage of the reset signal input to the reset terminal and supply the pull-up node with the first source voltage of the first source voltage terminal.

8. The gate driver according to claim 5, wherein the output terminal noise removing unit includes a ninth transistor connecting the output terminal to the first clock terminal depending on the voltage of the output terminal.

9. The gate driver according to claim 1, wherein the pull-down node is connected to a third clock terminal.

10. The gate driver according to claim 9, wherein different clock signals are input to the first to third clock terminals.

11. The gate driver according to claim 1, wherein the stage further includes a pull-down node charging and discharging unit charging the pull-down node with a second source voltage input to a second source voltage terminal and discharging the pull-down node in response to the clock signal input to the first clock terminal.

12. The gate driver according to claim 11, wherein the pull-down node charging and discharging unit includes:
   tenth and eleventh transistors supplying the pull-down node with the second source voltage input to the second source voltage terminal; and
   a twelfth transistor turned on in response to the gate-on voltage of the clock signal input to the first clock terminal and supply the pull-down node with the first source voltage of the second source voltage terminal.

13. The gate driver according to claim 12, wherein the gate electrode and the second electrode of the tenth transistor are connected to the second source voltage terminal and the first electrode thereof is connected to the gate electrode of the eleventh transistor, and wherein the first electrode of the eleventh transistor is connected to the pulldown node and the second electrode thereof is connected to the second source voltage terminal.

14. A display device comprising:

a display panel that includes data lines, gate lines intersecting the data lines, pixels connected to the data lines and the gate lines, and a gate driver including a plurality of stages outputting gate signals to the gate lines; and a data driver that supplies data voltages to the data lines, wherein a stage of the plurality of stages includes a pull-up transistor that outputs a clock signal input to a first clock terminal to an output terminal depending on a voltage of a pull-up node;

a pull-down transistor that outputs a first source voltage input to a first source voltage terminal to the output terminal depending on a voltage of a pull-down node; and a first noise removing unit that supplies a gate-off voltage to the pullup node to remove noise of the pull-up node in response to the clock signal input to the first clock terminal, wherein the first noise removing unit includes:

a first transistor turned on in response to a gate-on voltage of a first node and supply the first source voltage of the first source voltage terminal to the pull-up node; and a second transistor turned on in response to the gate-on voltage of the clock signal input to the first clock terminal and supply a gate-on voltage of the clock signal to the gate electrode of the first transistor.

15. The display device according to claim 14, wherein the first noise removing unit further includes a third transistor turned on in response to the gate-on voltage of the pull-up node and supply the first source voltage of the first source voltage terminal to the first node.

16. The display device according to claim 15, wherein the first noise removing unit further includes a fourth transistor turned on in response to the gate-on voltage of the pull-down node and supply the first source voltage of the first source voltage terminal to the first node.

17. The display device according to claim 14, wherein the stage further includes a second noise removing unit including a fifth transistor turned on in response to a gate-on voltage of another clock signal input to a second clock terminal and connect the pull-up node to a previous-stage output signal input terminal.

18. The display device according to claim 14, wherein the stage further includes:

a pull-up node charging and discharging unit charging the pull-up node with a gate-on voltage depending on a signal input to a start terminal or discharging the pull-up node to the gate-off voltage depending on a signal input to a subsequent stage output signal input terminal;

a pull-up node reset unit resetting the pull-up node in response to a reset signal input to a reset terminal; and an output terminal noise removing unit removing noise of the output terminal.

19. The display device according to claim 18, wherein the pull-up node charging and discharging unit includes:

a sixth transistor turned on in response to the gate-on voltage of the signal input to the start terminal and supply the pull-up node with a gate-on signal of the signal input to the start terminal; and a seventh transistor turned on in response to a gate-on voltage of the signal input to the subsequent-stage output signal input terminal and supply the pull-up node with the first source voltage of the first source voltage terminal.

20. The display device according to claim 18, wherein the pull-up node reset unit includes an eighth transistor turned on in response to a gate-on voltage of the reset signal input to the reset terminal and supply the pull-up node with the first source voltage of the first source voltage terminal.

* * * * *